United States Patent [19]

Stapleton

[11] 4,361,785
[45] Nov. 30, 1982

[54] VERSATILE VIDEO CRT DISPLAY

[75] Inventor: John J. Stapleton, East Brunswick, N.J.

[73] Assignee: K&R Engineering Sales Corporation, Flanders, N.J.

[21] Appl. No.: 80,587

[22] Filed: Oct. 1, 1979

[51] Int. Cl.³ .................... H01J 29/70; H01J 29/72
[52] U.S. Cl. ................................. 315/389; 315/382; 315/384
[58] Field of Search .............. 315/389, 396, 397, 382, 315/384

[56] References Cited

U.S. PATENT DOCUMENTS

| | | | |
|---|---|---|---|
| 3,758,813 | 9/1973 | Kitamura | 315/397 |
| 3,789,185 | 1/1974 | Baldwin et al. | 315/382 |
| 4,054,816 | 10/1977 | Keidl | 315/397 |
| 4,100,464 | 7/1978 | Ovenden | 315/397 |
| 4,129,807 | 12/1978 | Infante | 315/399 |

*Primary Examiner*—Theodore M. Blum
*Attorney, Agent, or Firm*—Lerner, David, Littenberg & Samuel

[57] ABSTRACT

A cathode ray tube display system for displaying data and/or pictorial images in an undistorted manner over the entire display screen. Programmable video polarity circuits add versatility to the system, enabling the cathode ray tube to be driven by any one of a variety of different drive circuits and effectively eliminating any skewing or delay experienced by the control signals as a result of the particular drive circuitry employed.

Versatile deflection of the cathode ray tube electron beam at low power levels is achieved through the use of deflection circuitry employing a feedback circuit for achieving linearity and a totem pole circuit employing a coupling diode for achieving rapid, automatic flyback during the retrace portion of the deflection cycle.

Automatic sizing of the display generated by the cathode ray tube (CRT) is obtained regardless of changes in the operating frequency of the horizontal and vertical sync signals employed to control the cathode ray tube. The sizing circuitry employs solid-state timer circuits, preferably of the integrated circuit type, which generate the necessary horizontal and vertical sweep circuits regardless of frequency changes experienced by the input sync signals.

A comparison circuit for use with the sizing circuit utilizes the logarithmic characteristics of semiconductor devices to provide a simple inexpensive circuit for comparing the peak level of a first sawtooth against a reference level for automatically adjusting the slope of an output sawtooth deflection signal, in accordance with the peak voltage of the input sawtooth, whose frequency is a function of the sync signals.

A distortion-free display over the entire CRT display screen is obtained through the use of a dynamic focus circuit which developes a dynamic focusing voltage for the cathode ray tube which is derived from the horizontal and deflection voltage sawtooth signals and is independent of the TV timing signal. The dynamic focus circuit employs low cost and yet reliable semiconductor devices. The circuitry for developing the dynamic focusing voltage includes amplifier circuits which produce differential outputs which are independently adjustable to properly focus the beam trace and thereby assure the generation of a distortion-free display.

An inverted or noninverted display may be selected in a simplified manner through the employment of the aforementioned programmable video circuits which enable the CRT to be driven by any one of a variety of different combinations of control circuitry without introducing skewing or delay problems.

50 Claims, 10 Drawing Figures

FIG. 4a (TYPE 555 TIMER)

VERSATILE VIDEO CRT DISPLAY

BACKGROUND OF THE INVENTION

Low cost cathode ray tube (CRT) data displays typically utilize standard television receiver circuitry which employs tightly tuned "high Q" deflection circuits and low video bandwidth for noise rejection. The imperfect interlacing experienced in such low cost receivers cause undesirable line pairing and interline flicker. The resulting display is so degraded seen at an arm's length distance, that it becomes necessary to limit use of the horizontal display lines to one-half of the 525 lines of the CRT raster, thus significantly reducing the resolution of the display.

Standard television circuitry has a 4.2 megaHertz bandwidth, a 15.75 kiloHertz line rate and a 10.2 microsecond retrace interval which limits the number of dots which may be displayed to 448 dots per line for cathode ray systems employed for data display purposes. In applications where compatibility of the display system with Hollerith type punch card inputs is desired, for a minimum 80 character per line display the capability of the above-mentioned system limits each character to a maximum of 5 dots per row, in order to stay beneath the maximum 448 dots permitted per line.

Although standard television type receivers are relatively inexpensive, efforts to modify such devices for purposes of producing data displays of high quality have nevertheless resulted in significant cost increases. Design techniques utilized to obtain improved performance have been so specialized as to lead to the development of special purpose monitors which unfortunately have limited areas of application.

The need for high quality information displays and the ability to provide a high quality display in compact low-cost systems having low power requirements dictate the need for a totally new design approach. The growth in need for displays to present computer outputs of 132 characters per line, for example, and for displaying the fine print in legal documents, typesetting apparatus and the like require display systems operating at significantly higher bandwidth and line frequency which requirements are not capable of being achieved in systems of the type described hereinabove, especially with the constraints of compact size, low power and low cost.

BRIEF DESCRIPTION OF THE INVENTION

The present invention relates to CRT display devices and more particularly to novel control circuits for CRT displays for providing a high quality, high resolution distortion-free display of reduced overall depth and having low power demand and whose control circuitry has the versatility of being automatically adaptable to a variety of different control inputs without the need for specialized interfaces.

The present invention is characterized by comprising control circuitry for cathode ray tube displays and the like and which employs novel, low cost, low power deflection means, automatic sizing means, dynamic focusing means and programmable video control means all of which act in synergism to provide a novel CRT display device of higher resolution than has heretofore been achieved in a CRT display of the compact size, low-cost and low-power demands of the present invention.

One of the major objectives of the CRT display device of the present invention is to provide a CRT display of compact size and low cost. In an attempt to achieve these objectives, a cathode ray tube having a 114° deflection angle, for example, was chosen with a view toward achieving the desire compact size. Although a CRT of this type contributes to a significant reduction in tube length and hence overall size of the display system, it is well known that the problem of obtaining a distortion-free display of high-resolution in the far corners of the display screen is more severe in tubes of the wide-angle deflection tube. As a result, a CRT having such a large deflection angle must be provided with dynamic focusing means, which capability is typically not provided in low-cost monitors due to both complexity and expense.

With a further view toward providing a high-quality, high-resolution display, it is advantageous to provide a 1,000 line raster at a 60 Hertz field rate and to allow each sweep frequency to be automatically changeable and dependent upon the needs of the particular application. This is accomplished by making the line and field frequency rate changeable under computer control and automatically changing the sweep sizes in accordance with the change in sweep frequency.

The conventional displays obtain horizontal deflection of the electron beam through the use of Class B amplifier driven resonant circuits. Since circuits of this type are not capable of handling variable input frequencies, this had led to the development of the efficient, resonant flyback circuit of the present invention which employs a negative feedback circuit having a low ohmic sense resistor for sensing current through the deflection yoke to enable the deflection circuit to deliver power on demand, reducing power requirements for deflection circuitry while at the same time achieving the desired, and in fact, necessary linear deflection. More specifically, the linear deflection control circuit employs a totem pole circuit which incorporates a coupling semiconductor device for automatically controlling flyback during the retrace portion of the cycle and without the need for a separate switching circuit and the accompanying switching signal for activation of the switching circuit. A negative feedback circuit incorporating a sensing resistor which measures current flow to the CRT deflection coil assures linear deflection of the cathode ray tube electron beam during the trace portion of the cycle.

During the trace portion of the cycle the totem pole transistors provide deflection current for the deflection coil in an alternating fashion which current varies in a linear fashion to provide linear deflection of the CRT electron beam. The totem pole transistors reverse conductive states at zero crossover of the sawtooth input signal. The voltage difference across the totem pole circuit is maintained within a range whose maximum value is of the order of several volts to minimize surge currents in the event of improper switching of the totem pole transistors. A feedback loop including a sensing resistor of low ohmic value develops a voltage representing the current through the deflection coil, which voltage is compared with the input sawtooth signal to assure linear deflection of the CRT electron beam.

During retrace, the conductive states of the totem pole transistors are again switched. However, the previously cut-off transistor is maintained in cut-off even though it is enabled to conduct, the coupling semiconductor causing energy stored in the deflection coil to be rapidly transferred to a capacitor which forms a resonant circuit with the deflection coil. The energy transferred to the capacitor of the resonant circuit is transferred back to the deflection coil within one-half cycle of the resonant circuit operating frequency which occurs during the retrace interval of the sawtooth deflection signal. The coupling semiconductor prevents a large negative swing of the voltage by clamping the voltage level substantially at ground potential upon termination of the retrace interval.

Since the totem pole circuit is disabled during the retrace interval, the feedback circuit is disabled, enabling the high open loop gain of the comparator circuit (i.e. operational amplifier) to abruptly cut off the previously conducting transistor of the totem pole circuit and enable the remaining transistor of said circuit which turns on upon termination of the retrace interval to initiate a new trace.

Central crossover distortion is minimized by the high open loop again occurring during crossover to rapidly reverse the conduction states of the clamping semiconductor and the previously cut off transistor of the totem pole circuit.

One preferred embodiment of the linear deflection control circuit employs a single output operational amplifier for optimum impedance matching and power transfer. The operational amplifier drives the totem pole circuit through a transformer coupling circuit. In still another alternative embodiment the transformer coupling may be replaced by current drivers and a phase splitter circuit. The operational amplifiers develop outputs such that the negative node of the deflection coil is equal to the positive input of the operational amplifier. In an alternative embodiment, the negative node is a virtual ground at which the input current signal is steered through a resistance divider circuit arranged in shunt with the sense resistor of the feedback circuit.

The linear feedback deflection control circuit effectively overcomes distortion due to the distributed resistance of the deflection coil and permits automatic sizing which significantly increases the versatility of the CRT display system.

The sizing circuit generates the sawtooth deflection signals which are automatically adjusted to fill the CRT display surface in spite of frequency changes in the sync signals. This is accomplished, in one preferred embodiment, by generating a first linear ramp signal of a predetermined slope and which is periodically reset by successive sync signals. The linear ramp is developed by charging a capacitor by means of a constant current source. A peak detection circuit senses the peak value of the ramp signal which is divided into a reference level to regulate the output current of an adjustable constant current source whose current magnitude is a function of the peak value of the linear input ramp. The output current of the adjustable current source charges a second capacitor to develop a ramp having a slope which is a function of the results of the aforementioned ratio operation. The output ramp reaches a constant peak value thereby assuring that the developed display fills the entire display surface.

In order to provide a more economical adjustment of the sawtooth signal over the permissible span of sweep frequencies, the ratio circuit of the last mentioned embodiment may be replaced with a non-linear comparison circuit for automatically regulating the output sawtooth to achieve a constant peak value, regardless of the peak value of the input sawtooth, so long as the input sawtooth lies within the aforesaid sweep rate limits.

The peak value of the input sawtooth is: converted to logarithmic form; subtracted from the logarithm of a fixed voltage; and the antilog of the difference is utilized to control the adjustable constant current source which charges the capacitor developing the output sawtooth. The logarithmic and antilog conversions are accomplished through the use of one integrated circuit employing inexpensive semiconductor devices.

In another alternative embodiment of the sizing circuit, the vertical and horizontal sawtooth deflection signals and their associated blanking signals are respectively generated by vertical and horizontal sync signals each of which initiate charging of an associated capacitor by a controlled current source whose output is a function of the peak amplitude of the ramp developed across the charging capacitor compared with a fixed reference level to drive the ramp signal so that its peak value reaches the reference level regardless of changes in the sync signal frequency. This sizing circuit is most effective when the operating frequency range is within one octave.

A peak detector retains the maximum level of the ramp signal and is designed so that its time constant is small enough to respond to changes in input frequency and long enough to assure linear operation. The comparison (operational amplifier) circuit includes low pass filter means to provide stability in the operating loop of the automatic sizing circuit.

A distortion-free display over the entire display surface is obtained by circuitry for generating dynamic focusing signals which are derived from the vertical and horizontal sawtooth deflection signals. The trace and retrace portions of the sawtooths are converted to linear M-shaped waveforms. The square law characteristic of field effect transistor (FET's) is employed to convert the linear waveforms to parabolic waveshapes. The dual FET's are interconnected in a manner to enable center focus adjustment through simple adjustment of a single potentiometer. The focus voltages of each edge of the display surface may be adjusted independently of one another through the use of differential amplifiers employing adjustable voltage divider circuits to maximize focus and compensate for tube tolerances of the CRT and thereby minimize costly interactions.

The CRT display may be interfaced to operate under the control of data and blanking signals provided in any one of sixteen combinations of control inputs through the use of programmable coupling circuitry which interconnects the control signals with the CRT inputs without the introduction of skewing or delay problems normally encountered through the use of conventional buffers and/or inverter circuits.

The logic gates allow generation of inverted or uninverted displays as well as providing displays of different intensity levels. The logic gates drive cascode transistors which are all coupled in common to a regulating transistor provided to compensate for any base-emitter drift experienced by the amplifier transistors.

OBJECTS OF THE INVENTION AND BRIEF DESCRIPTION OF THE FIGURES

It is therefore one object of the present invention to provide a cathode ray tube type display system capable of displaying data having high resolution and uniform size and quality over the entire display area, said capabilities being obtained through simplified and inexpensive circuitry as compared with conventional techniques.

Still another object of the present invention is to achieve the objectives set forth hereinabove through the employment of low power deflection control circuitry which cooperates with the cathode ray tube display device to develop linear deflection signals.

Still another object of the present invention is to provide deflection control means for cathode ray tube display devices and the like which employs a novel totem pole circuit having intermediate semiconductor-type coupling means to prevent erroneous operation of the totem pole circuit and thereby assure generation of the desired sawtooth signal.

Still another object of the present invention is to provide novel deflection means for cathode ray tube display devices and the like and having amplification means including a feedback circuit which utilizes a small fraction of the output energy for comparing the output signal to the input control signal to assure the generation of linear deflection signals, said circuitry also including the capability of providing open-loop gain during the retrace portion of the cycle, assuring rapid retrace over the requisite minimum time interval.

Still another object of the present invention is to provide deflection control means for imparting linear deflection to a CRT electron beam comprising energy storage means controlled by one branch of a totem pole circuit for rapidly removing energy stored in the CRT deflection coil during the retrace portion of a deflection signal cycle without the need for an additional switching circuit.

Still another object of the present invention is to provide dynamic focusing means for cathode ray tube display devices and the like having the capability of generating focusing signals through the employment of inexpensive solid-state components to assure uniform focusing of the display device electron beam over the entire display surface.

Still another object of the present invention is to provide novel focusing means for cathode ray tube display devices and the like which utilizes circuitry for generating absolute magnitude signals and including adjustable means which allows for independent focus adjustments in each quadrant of the display surface.

Still another object of the present invention is to provide automatic sizing circuitry for use with cathode ray tube display devices and the like having a capability of assuring utilization of the entire display surface of the display device regardless of frequency variations in the sync signals employed for controlling the sawtooth deflection signals used to deflect the cathode ray beam of the display device.

Still another object of the present invention is to provide novel comparison means for use with an automatic sizing circuit which is capable of comparing a signal level representing the repetition rate of sync signals, with a predetermined reference level, which ratio-comparison circuit employs modular circuit components for generating a signal representative of the comparison operations to a high degree of precision.

Still another object of the present invention is to provide novel comparison circuitry for use with automatic sizing circuits which circuitry employs simple, inexpensive solid-state devices for converting the signals to be compared into logarithmic representations of the signals to simplify the comparison operation and thereafter generate the antilog of the result of the comparison operation for controlling the automatic sizing circuitry.

Still another object of the present invention is to provide novel programmable interfacing circuits for coupling control signals to cathode ray tube type display devices and the like which permit various combinations of electrical connections between the display device and the control output signals without introducing skewing and/or delay problems typically encountered with conventional coupling circuits.

The above as well as other objects of the present invention will become apparent while reading the accompanying description and drawings in which:

FIG. 4a is a simplified block diagram showing one of the timer circuits of FIG. 4 in greater detail.

DETAILED DESCRIPTION OF THE INVENTION AND ITS PREFERRED EMBODIMENTS

Figure 1:
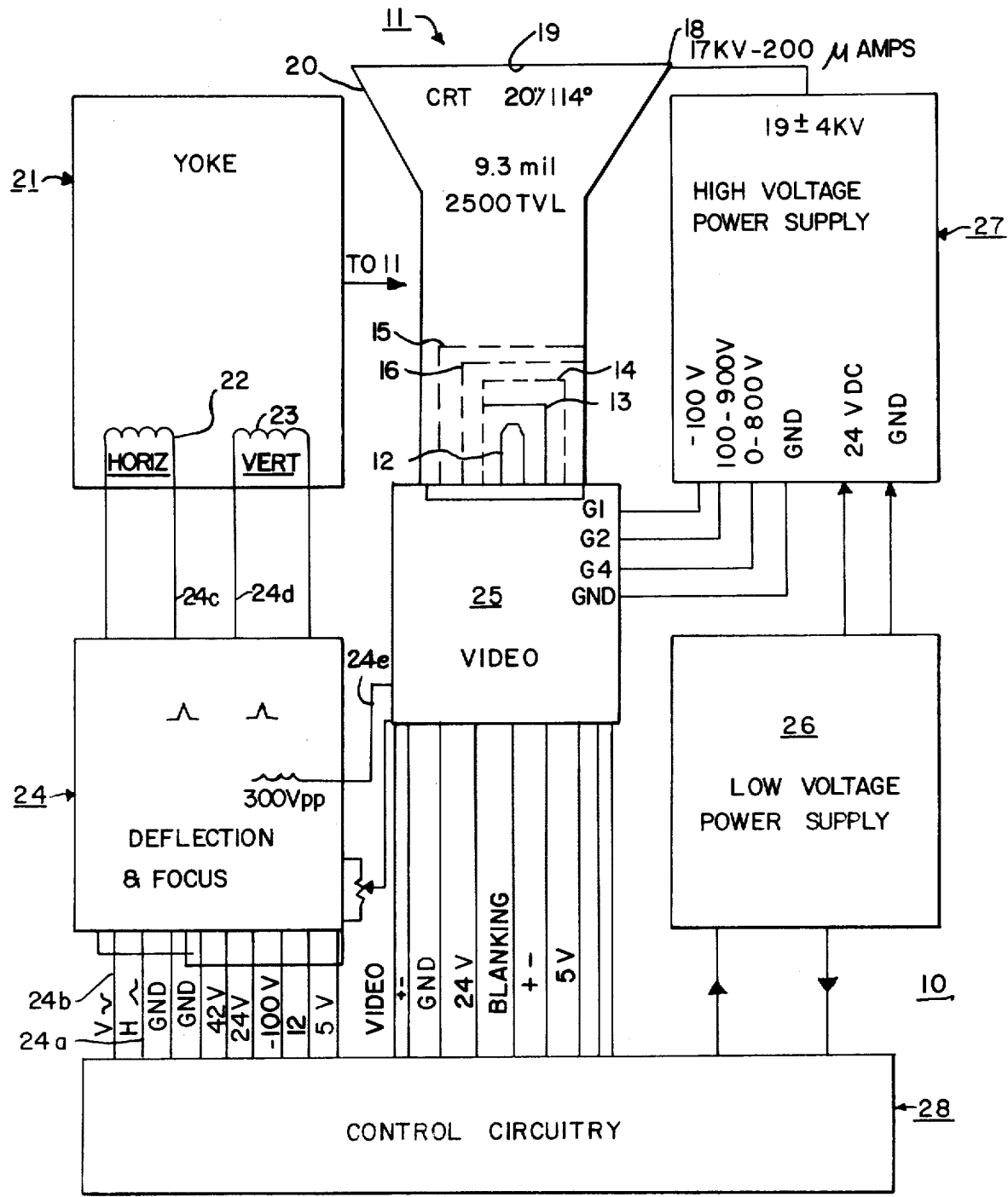
FIG. 1 shows a simplified block diagram of a cathode ray tube type display system.

FIG. 1 shows a display system 10 of the cathode ray tube type which is comprised of a display tube 11 of the cathode ray tube type. One suitable cathode ray tube which may be employed in the system 10 is manufactured by Clinton. The tube has a 20 inch tube face and, in order to reduce the overall length of the tube, the tube chosen has a deflection angle of 114°. The tube is provided with a cathode 13, a heater 12 for heating cathode 13 to a level sufficient to emit electrons, a control grid 14, a focusing electrode 15, a pre-accelerating electrode 16, (a second control grid), and an accelerating electrode 18 positioned adjacent the tube face 19 which has its interior surface coated with a suitable phosphor which becomes luminescent when struck by the accelerated electrons. The entire assembly is enclosed within a container or housing 20, typically formed of glass, which housing is evacuated to a pressure typically of the order of $10^{-9}$ atmosphere.

In cathode ray tubes employing magnetic deflection, a magnetic field is utilized to deflect the electron beam in order to move the beam across the screen and thereby develop a raster. The magnetic field is produced by an instantaneous current provided in each of a pair of coils, arranged in a yoke assembly 21 shown as a separate block of FIG. 1, which yoke assembly 21 includes a pair of deflection coils 22, 23 arranged about the exterior of housing 20 so as to encircle the housing and oriented to direct the generated magnetic fields to be perpendicular to the electron beam path, said coils 22 and 23 being designed to respectively impart horizontal and vertical deflection to the electron beam to form a typical raster made up of a plurality of vertically or horizontally oriented sweeps or lines wherein 200 to 2000 such sweeps or lines are utilized to make up a single raster. The sweeps are refreshed at a predetermined refresh rate sufficient to cause the illuminated portions of the luminiscent phosphor material to appear to the human eye to be constantly illuminated without data smearing.

The horizontal and vertical deflection sawtooth signals, as well as the focusing signal are developed by the deflection and focusing circuit 24 comprised of means for deriving horizontal and vertical sync signals at its inputs 24a and 24b respectively, for generating the necessary sawtooth deflection signals which appear at outputs 24c and 24d and are respectively coupled to the horizontal and vertical deflection windings 22 and 23. The deflection and focus circuit 24 also generates a dynamic focusing signal which appears at its output 24e for application through video circuit 25 to the focusing electrode of the cathode ray tube display device 11, as will be more fully described.

A low voltage power supply 26 provides low voltage DC power to the high voltage power supply 27, deflection and focus circuitry 24 and video circuitry 25 through the control circuitry 28, which is also supplied low voltage DC power for its operation, through the low voltage power supply 26.

The video circuitry 25 is utilized to provide digital type control signals of a level and polarity necessary to operate the cathode ray tube 20, which signals are typically comprised of digital data signals for unblanking the cathode ray tube at those positions where data is to be displayed and for blanking the electron beam at those positions where no data is to be displayed and further during the retrace intervals of the horizontal and vertical deflection signals.

In systems for use in providing printouts at the line capacity normally provided by computer hard copy printers, such as 132 characters per line, or in systems in which it is desired to provide the desired fine print utilized, for example, in legal documents, phototypesetting and like applications, the display system requires higher bandwidth and line frequency capabilities than those available in conventional devices such as of the TV receiver type. Receivers of this type typically have a bandwidth of 4.2 megaHertz at a 15,750 Hertz line rate and 10.2 microsecond retrace, which limits the number of dots capable of being reproduced on each line, i.e. each horizontal sweep of the cathode ray tube, to 448. Employing such conventional systems for an 80 character per line display, the operating speeds permit a resolution of only five horizontally aligned dots per character. In order to produce displays of 132 characters per line the bandwidth and line frequency of the system must be significantly increased.

In applications where it is desired to utilize the display device for flexible fonts of characters, i.e. for fonts requiring different degrees of resolution, such as Chinese characters, automatic sizing is necessary for assuring that the entire display face is utilized regardless of the particular character fonts desired to be displayed. In applications where it is desired to display rapid pictorial scenes such as, for example, fast periscope panning or low flying aircraft applications, higher frame rates must be provided.

The display system thus must be sufficiently versatile to accommodate the above requirements; must be less dependent on time dependent signals in order to cause the system to be synchronized by input signals with flexible formats and must be able to produce data displays with variable characteristics in a repeatable fashion. In FIG. 1, for example, the high voltage power supply is preferably a highly regulated type power supply employing a low noise DC to DC converter, for example, and which is capable of converting from 24 volts DC to 17,000 volts and operating at its optimum frequency which is asynchronous to the display raster without creating any interference despite the presence of variable beam current loads.

DEFLECTION SYSTEM

In order to obtain the desired objectives of providing a display of high quality, high resolution characters of uniform size regardless of the position they occupy on the cathode ray tube display surface, the electron beam must be deflected in a linear manner. It is well known to use deflection systems employing resonant flyback techniques due to their high efficiency and low cost. The voltage E across the deflection coil, which may be characterized as having an inductance L, produces a change dI current I during a time increment dt, since the current through an inductor cannot change instantaneously but changes as a function of time. The current may be described by the following equation:

$$E/L = di/dt$$

An instantaneous interruption of the voltage placed across the inductor L, which may be achieved by opening switching means (to be more fully described) which couples the supply voltage to the inductor, causes an instantaneous shift in the energy ($\frac{1}{2} LI^2$) stored by inductance L to a capacitance C forming a resonant circuit with inductor L, said energy transfer occurring at the resonant frequency given by the equation:

$$2\pi f = \omega = (LC)^{-\frac{1}{2}}$$

Figure 2:
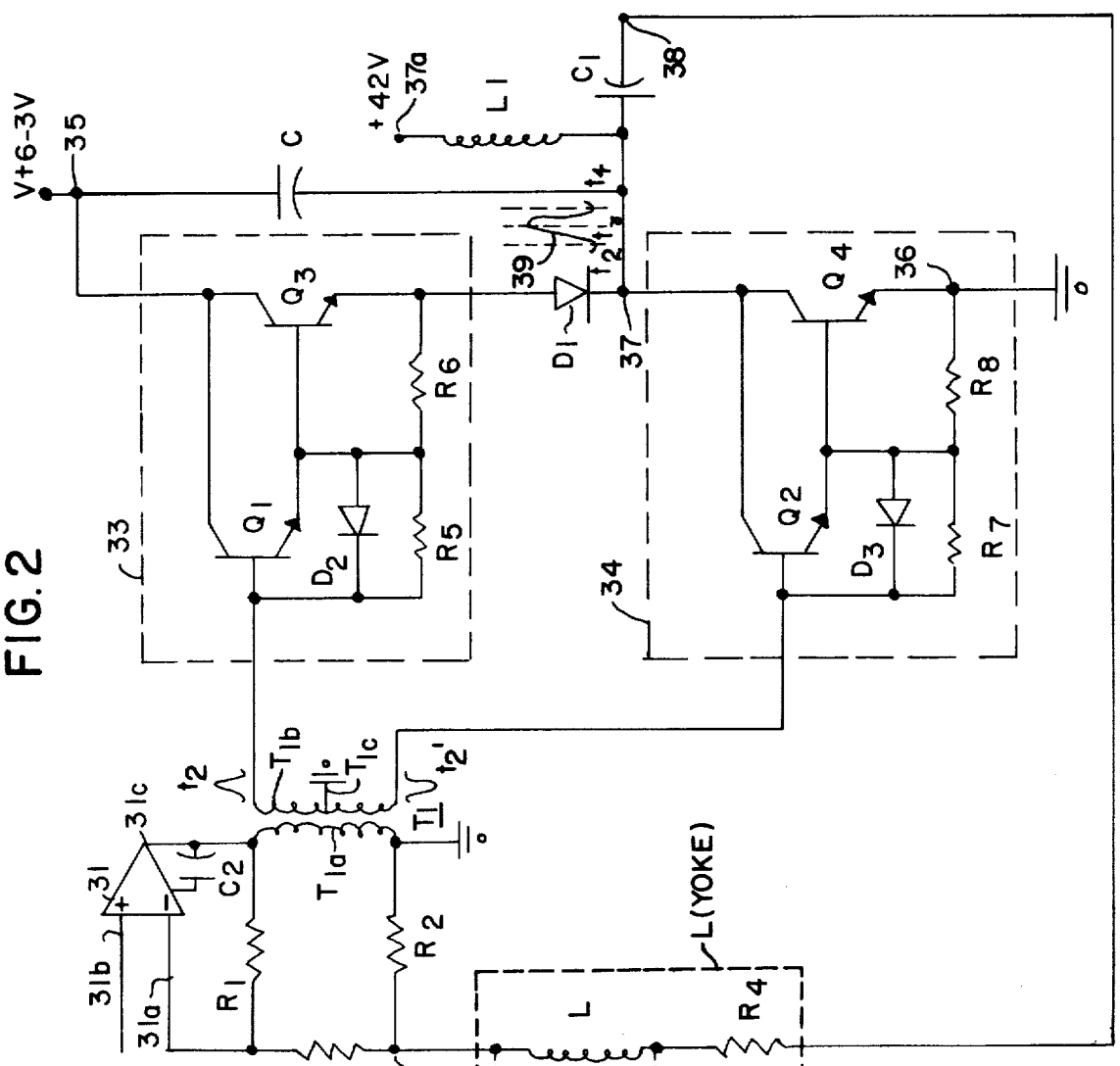
FIG. 2 shows a deflection signal control circuit which may be utilized with the display system of FIG. 1 to assure the generation of linear deflection signals.

FIG. 2 shows a deflection circuit 30 for use in circuit 24 of FIG. 1 and designed in accordance with the principles of the present invention and incorporating the abovementioned deflection coil L and capacitor C forming a tuned circuit with deflection coil L. Separate circuits 30 may be used for each coil 22 and 23 of yoke assembly 21.

The peak current Ip delivered to capacitor C charges capacitor C initially in accordance with the equation:

$$dV/dt = Ip/C$$

Capacitor C charges until a lagging voltage peak, $Vp = Ip\omega L$ is reached, at which time the current through capacitor C falls substantially to zero. The energy previously stored in deflection coil L is now stored in capacitor C which energy is represented by ($\frac{1}{2} CV^2$). Due to the nature of the LC resonance circuit, the energy stored by capacitor C is transferred back to the deflection coil L, which transfer of energy to capacitor C from inductor L and back to inductor L from capacitor C, occurs during a half cycle at the resonant frequency. This half cycle of operation of the resonant frequency occurs during the interval of the retrace portion of the sawtooth deflection signal utilized to drive the deflection coil L, as will be set forth in greater detail hereinbelow.

The circuitry 30 shown in FIG. 2 for providing linear deflection of the cathode ray tube electron beam is comprised of operational amplifier 31 having inverting input 31a and non-inverting input 31b. Output 31c is coupled to inverting input 31a through a circuit path comprised of resistor R1. Output 31c is connected to ground through the primary winding T1a of a transformer T1. Sensing resistor R2 (to be more fully described) is connected between ground and resistor R3. One terminal of deflection coil L is connected to the common terminal 32 between resistors R2 and R3. The opposite terminal of resistor R3 is connected to inverting input 31a. Deflection coil L has a distributed capacitance represented by the discrete component C3 and has a distributed resistance represented by the discrete component R4.

The secondary winding T1b of transformer T1 has its center-tap T1c connected to ground and has its end terminals coupled respectively to the base electrodes of transistors Q1 and Q2.

Transistor Q1 is coupled in a manner shown with transistor Q3 and transistor Q2 is connected in the manner shown with transistor Q4 to respectively form first and second current amplifying circuits 33 and 34 of the Darlington type. Diode 22 of Darlington circuit 33 limits the permissible voltage across the emitter and base electrodes of transistor Q1. Resistors R5 and R6 serve to reduce the input impedance of the Darlington circuit 33. Diode D3 and resistors R7 and R8 of Darlington circuit 34 function in a similar manner.

Transistors Q3 and Q4, together with the coupling diode D1 form a novel totem pole output stage. The collector of Q3 is coupled to the V+ terminal 35 while the emitter of Q4 is connected to ground or reference potential. The transistors Q3 and Q4 (in the "top" and "bottom" halves of the totem pole circuit), i.e. the Darlington circuits 33 and 34 are coupled to conduct in a mutually exclusive fashion as will be more fully described. The "top" and "bottom" halves of the totem pole output stage are designed to provide output voltages which are substantially the same. Thus the voltage V+ is selected so that its value is V+=VcesatQ4, where VcesatQ4 represents the collector to emitter voltage drop of transistor Q4 at saturation, in order that the voltage delivered from the "top" half of the totem pole circuit to terminal 37 is substantially equal to the voltage delivered by the "bottom" half of the totem circuit by transistor Q4 to common terminal 37. This arrangement also assures that surge currents will be minimal even in the event that transistor Q4 is turned on before transistor Q3 is completely cut off, which occurs at the center of the trace, as will be more fully described.

Figure 5:
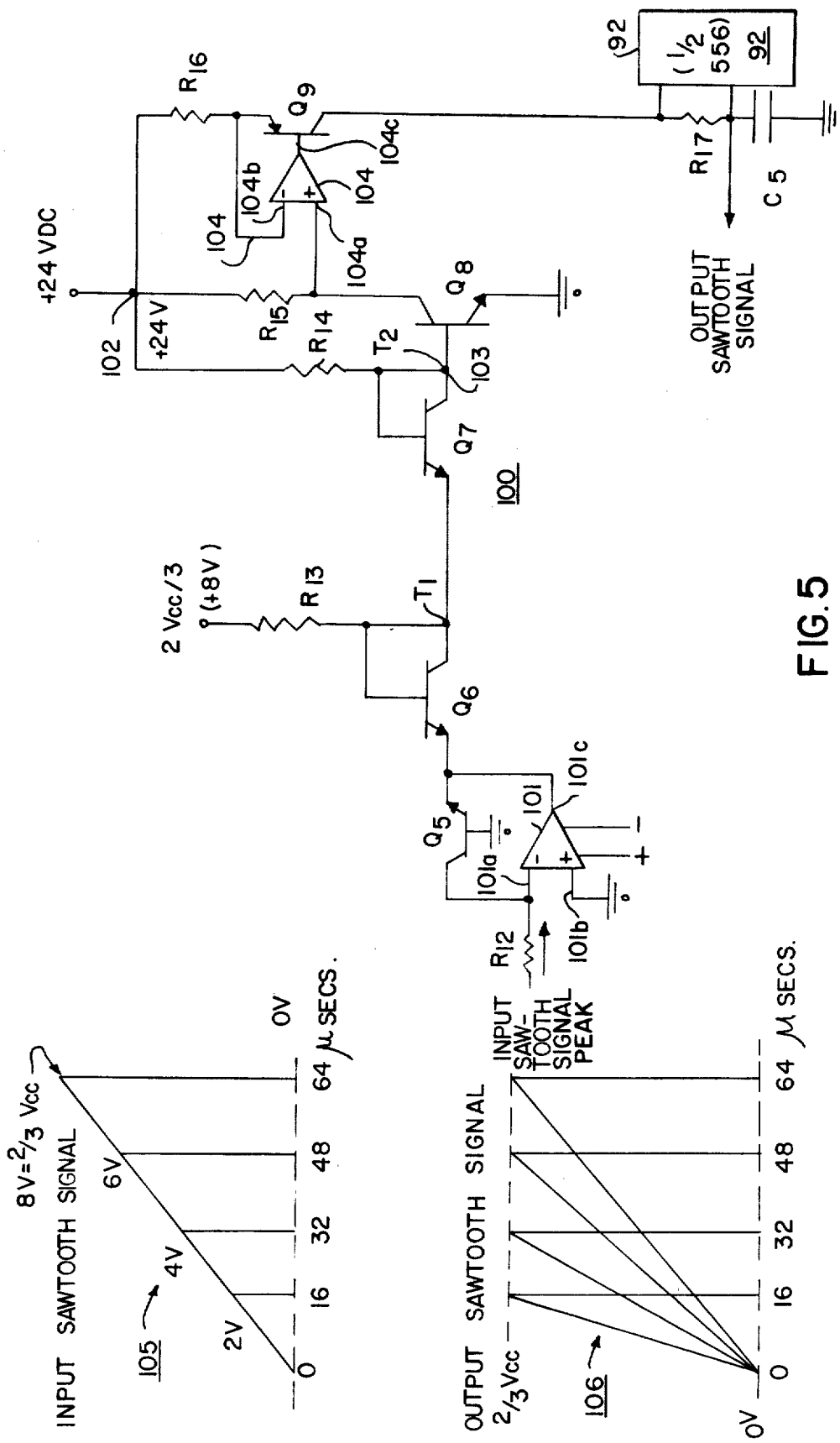
FIG. 5 shows a non-linear circuit which may be substituted for the comparison circuit utilized in the automatic sizing circuit of FIG. 4.

A retrace having an interval of 4 microseconds is a practical reality employing the circuit 30 of FIG. 5 at an 80% scan efficiency even at an operating frequency of 50 kiloHertz without exceeding the electrical code requirements of a 42 volt level and without exceeding the breakdown voltage of the power transistors employed in the circuit. For example, deflection coil L having an inductance of 175 microhenries requires 3.9 amps to deflect an electron beam 42' when an acceleration voltage of 17 kilovolts is employed. Thus, $$Vp = Ip\omega L = 3.9(2\pi/8 \times 10^{-6})(175 \times 10^{-6}) = 536 \text{ volts}$$

for line (i.e. "x") deflection. The circuit 30 may be employed for both the field ("y") and the line ("x") deflection control circuits. The field (i.e. "y") deflection coil may have 100 times the inductance and requires only 0.5 amps to deflect the electron beam 49° which is the longer side of a cathode ray tube having a 20 inch display face. The CRT and/or yoke may be rotated ±90° from conventional alignment.

The circuit 30 further employs a large inductance L1 and large capacitor C1 which cooperate to maintain the average current through deflection coil L centered at zero and further permit the use of a linear feedback system during the trace portion of a deflection cycle. L1 blocks high frequency from the supply level at terminal 37a.

The operation of the circuit 30 of FIG. 2 is as follows:

A linear sawtooth signal represented by the waveform 36 is applied to the noninverting input 31b of operation amplifier 31. The signal is comprised of a linear ramp 36a having a negative slope and persisting over the trace portion T of a full cycle C, and a portion 36b, which need not necessarily be linear, and which persists over the retrace portion R of a full cycle C such that, for each and every cycle, C=T+R. At time $t_0$ a cycle is initiated at which time operational amplifier 31 causes the end terminals of the secondary winding T1b of coupling transformer T1 to develop the positive and negative going waveform signals $t_2$ and $t_2$, respectively, which respectively drive transistor Q3 (i.e. Darlington circuit 33) into conduction and transistor Q4 (i.e. Darlington circuit 34) into cutoff. At this time, the voltage at terminal 38 of deflection coil L experiences a drop from a nominal value of +42 volts below ground or reference potential. A portion of the current through deflection coil L is developed across sense resistor R2 having a small ohmic value no greater than several ohms and preferably on the order of a fraction of one ohm. In the preferred embodiment, the value of resistor R2 was set at 0.10 ohms. The inductance of the sense resistor R2 should also be small and preferably no greater than 0.1% of the inductance of the deflection coil L. The voltage drop developed across sensor resistor R2 is substantially equal to the instantaneous input voltage applied to the noninverting input 31b of operational amplifier 31 so as to assure the generation of linear deflection currents which in turn assures the desired deflection of the electron beam.

Figure 3:
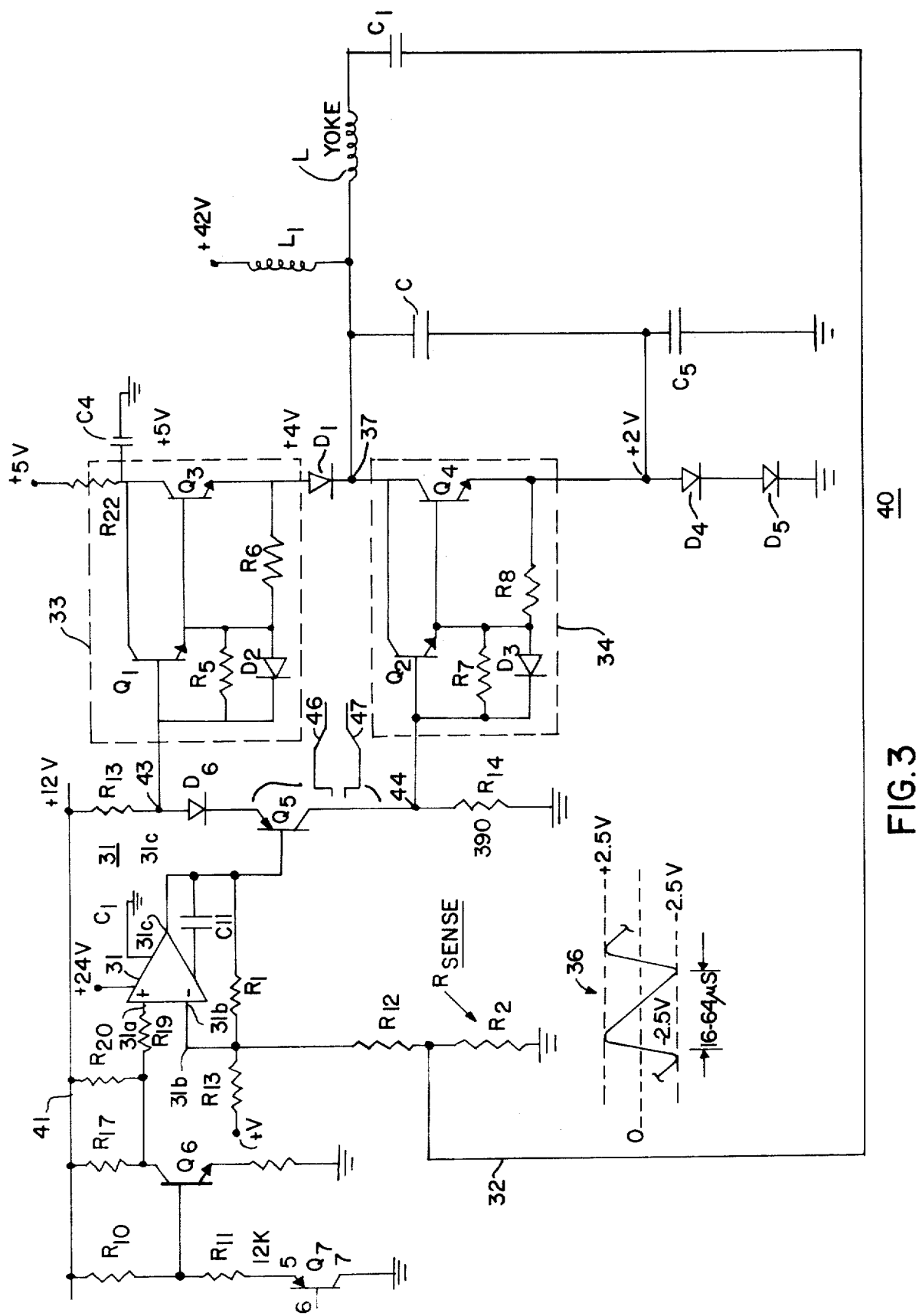
FIG. 3 shows an alternative embodiment for the deflection control circuit of FIG. 2.

The voltage at terminal 32 continues to drop in a linear fashion from a positive maximum value toward ground potential with a view toward ultimately dropping to a maximum negative value −Vmax as shown by the waveform diagram of signal 36 forming part of FIG. 3. The signal at terminal 37 and the signal 36 both go through their crossover level, whereby transistor Q3 is driven into cutoff and transistor Q4 begins to conduct. Transistor Q3 thus serves as a current source during the interval from $t_0$ to $t_1$. At time $t_1$, the instantaneous input signal at the noninverting input terminal 31b is negative causing the signal polarities at the output end terminals of secondary winding $t_{1b}$ to reverse, driving transistor Q4 into conduction. As terminal 32 goes toward a negative potential level from the ground or reference level, diode D1 no longer conducts whereby the "top" portion of the totem pole circuit serves as a current source for deflection coil L from time $t_0$ to time $t_1$. Thus, it can be seen that transistor Q4 acts as a current sink for deflection coil L during the time $t_1$ to $t_2$ while transistor Q3 and diode D1 serve as a current source for coil L during the time from $t_0$ to $t_1$.

At time $t_2$, the signal 36 reverses direction, driving transistor Q4 into cutoff while transistor Q3 is enabled to conduct. At this time, however, the instantaneous removal of the current sink from deflection coil L causes the energy stored by the deflection coil L to be transferred to capacitor C so that at time $t_2$ terminal 37 begins to go more positive relative to terminal 35. Diode D1 is poled to prevent transistor Q3 and diode D1 from conducting. The voltage at terminal 37 begins to build from substantially ground potential up to a maximum value $+V_p$ in accordance with the waveform 39 representing the rate of change of voltage across capacitor C, which change occurs at the resonant frequency of the tuned circuit formed by deflection coil L and capacitor C. The voltage across capacitor C builds to a maximum value $+V_p$ during the first quarter cycle of the resonant frequency after which the voltage decays to a minimum value during the second quarter of the resonant frequency cycle. Thus, during the time from $t_2$ to $t_3$, energy stored in deflection coil L is transferred to capacitor C and during the time from $t_3$ to $t_4$ the energy previously stored in capacitor C is transferred back to deflection coil L. Since both the top and bottom halves of the totem circuit are disabled during the resonant retrace interval i.e., from $t_2$ to $t_4$, the feedback loop is disabled and the high open-loop gain of operational amplifier 31 assures that transistor Q4 is abruptly driven into cutoff and the transistor Q3 is driven to a voltage level sufficient to allow transistor Q3 to reach saturation as soon as the resonant voltage at terminal 37 drops below a value equal to the collector emitter voltage across transistor Q4 at saturation (which is approximately 1.5 volts).

The feedback loop is closed at time $t_4$ enabling the cycle to be repeated whereby transistor Q3 is driven into conduction and transistor Q4 is maintained in cutoff enabling transistor Q3 to again function as a current source during the first half of the trace portion of the cycle and thereafter allowing transistor Q4 to turn on and transistor Q3 to be driven to cutoff during the latter half of the trace portion T of a sawtooth cycle C.

Central crossover distortion is minimized due to the fact that the "top" and "bottom" halves of the totem pole circuit are cut off for a brief interval on both sides of the crossover occurring at time $t_1$ at which time the feedback circuit is open enabling the high open-loop gain of operational amplifier 31 to control the clamping diode D1 and transistor Q3 to undergo a rapid switchover between conduction and non-conduction.

The utilization of a single output operational amplifier 31 to provide the differential base electrode drives for the Darlington circuits 33 and 34 through coupling transistor T1 optimizes the impedance matching and power transfer of the circuit.

The use of a linear feedback deflection system serves to overcome distortion caused by the distributed resistance R4 of the deflection coil L.

FIG. 3 shows another alternative embodiment for the linear deflection circuit of FIG. 2 wherein like components are designated by like reference numerals.

The alternative embodiment 40 of FIG. 3 differs from that circuit of FIG. 2 in that the coupling transformer T1 is replaced by a phase splitter circuit comprised of transistor Q5.

Figure 2A:
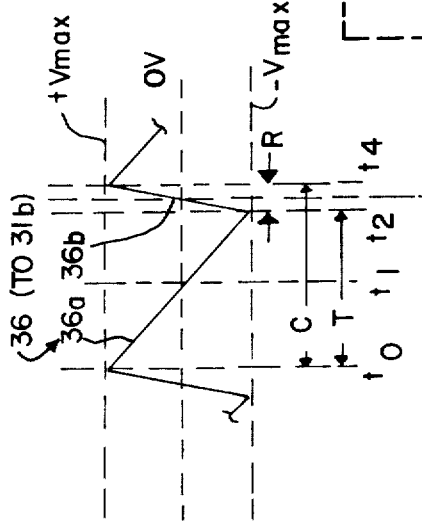
FIG. 2a is a schematic diagram of a modified totem pole circuit which may be substituted for the totem pole circuit of either FIG. 2 or FIG. 3.
Figure 2A:
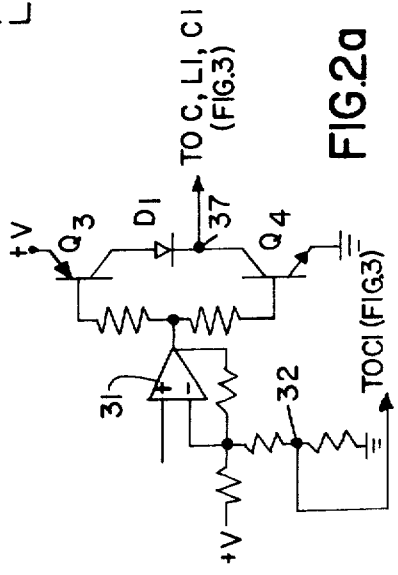

The circuitry 40 of FIG. 3 differs from the circuitry 30 of FIG. 2a in that coupling transformer T1 and phase splitter circuit comprised of transistor Q5 are obviated by the PNP Darlington Q3.

More specifically, operational amplifier 31 has its non-inverting input 31a coupled to the collector of transistor Q6 whose base electrode is coupled to the emitter electrode of transistor Q7 through resistor R11 which forms a series circuit with resistor R10. Resistor R10 is coupled to the +12 volt DC bus 41. The collector of transistor Q7 is coupled to ground or reference potential. Transistor Q7 serves as a noninverting emitter-follower circuit for current amplification whereas transistor Q6 serves to invert the positive going sawtooth ramp to a negative going ramp similar to that shown by waveform 36 in FIG. 2. The output 31c of operational amplifier 31 is coupled to the inverting input 31b by resistor R1. The sensing resistor R2 is coupled between ground or reference potential and the common terminal between capacitor C1 and adjustable resistor R12. Adjustable resistor R12 is connected in common to resistors R1 and R13 which common terminal is connected to the inverting input 31b of operational amplifier 31. Inverting input 31b is thus coupled to the +24 volt DC terminal 42 through resistor R13.

Output terminal 31c of operational amplifier 31 is coupled to the base electrode of transistor Q5 which is coupled to operate as a phase splitter having its emitter electrode coupled to the +12 volt DC bus 41 through the series electrical path comprised of resistor R13 and diode D6. The collector electrode of Q5 is coupled to ground or reference potential through resistor R14. Common terminal 43 between resistor R13 and diode D6 is coupled to the base electrode of transistor Q1 which, together with transistor Q3, forms the Darlington circuit 33. The collector terminal 44 is coupled to the base electrode of transistor Q2 which, together with transistor Q4 forms the Darlington emitter-follower circuit 34.

In the circuit shown in FIG. 3, the capacitor C which forms a resonant circuit with deflection coil L is connected across the collector and emitter electrodes of transistor Q4. Capacitor C4 is provided for voltage regulation at the collector of Q3. Series connected diodes D4 and D5 are coupled between the emitter of Q4 and reference potential. Capacitor C5 is connected in electrical parallel across diodes D4 and D5. This parallel circuit forms a self-biasing circuit for DC voltage regulation at the emitter of Q4. Capacitor C1 serves to block DC voltage. Booster choke L1 provides deflection coil L with the energy lost during the trace portion T of the full cycle C of sawtooth signal 36.

The operation of the circuit 40 is as follows:

The sawtooth signal 36 of FIG. 3 raised 12 volts to the non-inverting input 31a of operational amplifier 31 is otherwise identical to the sawtooth signal 36 shown in FIG. 2. At time $t_0$ (see FIG. 2), the output 31c of operational amplifier 31 drives phase splitter 44 to generate the waveforms 46 and 47 at terminals 43 and 44 respectively. Transistor Q3 (of the totem pole circuit comprised of transistors Q3 and Q4 and diode D1) conducts and serves as a current source causing the current at terminal 37 to change from a maximum level Ip toward minimum level −Ip in a linear fashion in accordance with the negative slope ramp 36a. At the crossover point, time $t_1$, the input sawtooth signal goes negative causing transistor Q3 to be driven into cutoff and causing transistor Q4 to be driven into conduction at the crossover signal level, which at terminal 37 is of the order of 3 volts, transistor Q3 and diode D1 collectively serve as a current source to supply current to deflection coil L between time $t_0$ and $t_1$. For a brief time interval slightly before and slightly after time $t_1$, the top and bottom halves of the totem pole output stage are both in cutoff whereby the open-loop gain of operational amplifier 31 completely and abruptly reverses the conductive states of transistors Q3 and Q4 whereupon Q3 and diode D1 no longer conduct and transistor Q4 is driven into conduction thereby minimizing distortion at the crossover level. Current is sunk into the bottom half of the totem pole circuit by deflection coil L until time $t_2$ whereupon a rapid reversal in the sawtooth input signal 36, as represented by signal portion 36b, causes transistor Q4 to be driven into cutoff and enables transistor Q3 to be turned on. However, at this time, due to the decoupling of transistor Q3 from deflection coil L, the energy stored in deflection coil L is transferred to capacitor C at a rate determined by the resonant frequency of the tuned circuit comprised of deflection coil L and capacitor C whereupon the voltage at terminal 37 begins to go positive during the first quarter of a cycle at the resonant frequency. Diode D1 back biases the top half of the totem pole circuit preventing transistor Q3 from conducting. The voltage level at terminal 37 builds to a maximum level Vp at the end of the first quarter cycle at which time substantially all of the energy previously stored in deflection coil L is transferred to capacitor C. During the second quarter of the cycle at the resonant frequency, the energy transferred to capacitor C is transferred back to deflection coil L whereupon the voltage level at terminal 37 drops from a maximum value Vp to a level of the order of +3 volts. During this time, i.e. between time $t_2$ and $t_4$, both halves of the totem pole circuit are in cutoff disabling the feedback path whereby the open-loop gain of operational amplifier 31 assures an extremely abrupt switching of the totem pole circuit so that the retrace interval is of very short duration and is of a length equal to the time duration of one-half cycle of the resonant frequency. At time $t_4$, the sawtooth input signal reverses to drive transistor Q3 into conduction and to drive transistor Q4 into cutoff whereupon the cycle is repeated.

As was mentioned hereinabove, the voltage developed across sense resistor R2 represents the current through deflection coil L and thereby controls the operational amplifier 31 to drive the totem pole circuit in such a manner to cause the deflection coil L to deflect the electron beam in the desired linear manner. The losses of deflection coil L due to resistor R4 are thus compensated for by the feedback circuit to assure that the deflection control circuit 40 will operate the deflection coil L to deflect the electron beam in a linear fashion. The yoke 21 has pincushion magnets (not shown for purposes of simplicity) which cooperate with conventional correction electronics provided in circuit 24 to minimize geometric distortions.

The totem pole circuit may be modified as shown in FIG. 2a wherein the phase splitter transistor Q5 of FIG. 2 (or transformer T1 of FIG. 3) may be eliminated. The base electrodes of Q3 and Q4 are driven directly by the output of operational amplifier 31. The operation of the totem pole circuit of FIG. 2a is similar to that of FIG. 2 (or FIG. 3). The operational amplifier is adjusted to make the negative node of the deflection coil L equal to the voltage at the positive input of the operational amplifier 31. Alternatively, the negative node of coil L may be made a virtual ground at which the input current is steered through the resistor divider R1, R12, R13 shunting sense resistor R2.

DYNAMIC FOCUSING

The versatility of the video display system described herein must be capable of maintaining the electron beam in focus regardless of changes in operating frequency of the cathode ray display system which, ideally must be capable of operating at different frequencies to achieve the desired objective of providing a capability of displaying flexible type fonts of different degrees of resolution. This is conventionally obtained through use of either double integrator circuits or expensive multipliers which significantly increase both the cost and complexity of a display system which is contrary to one major objective of the present invention which is to provide a versatile video display system of reduced complexity and significantly reduced cost.

Figure 7:
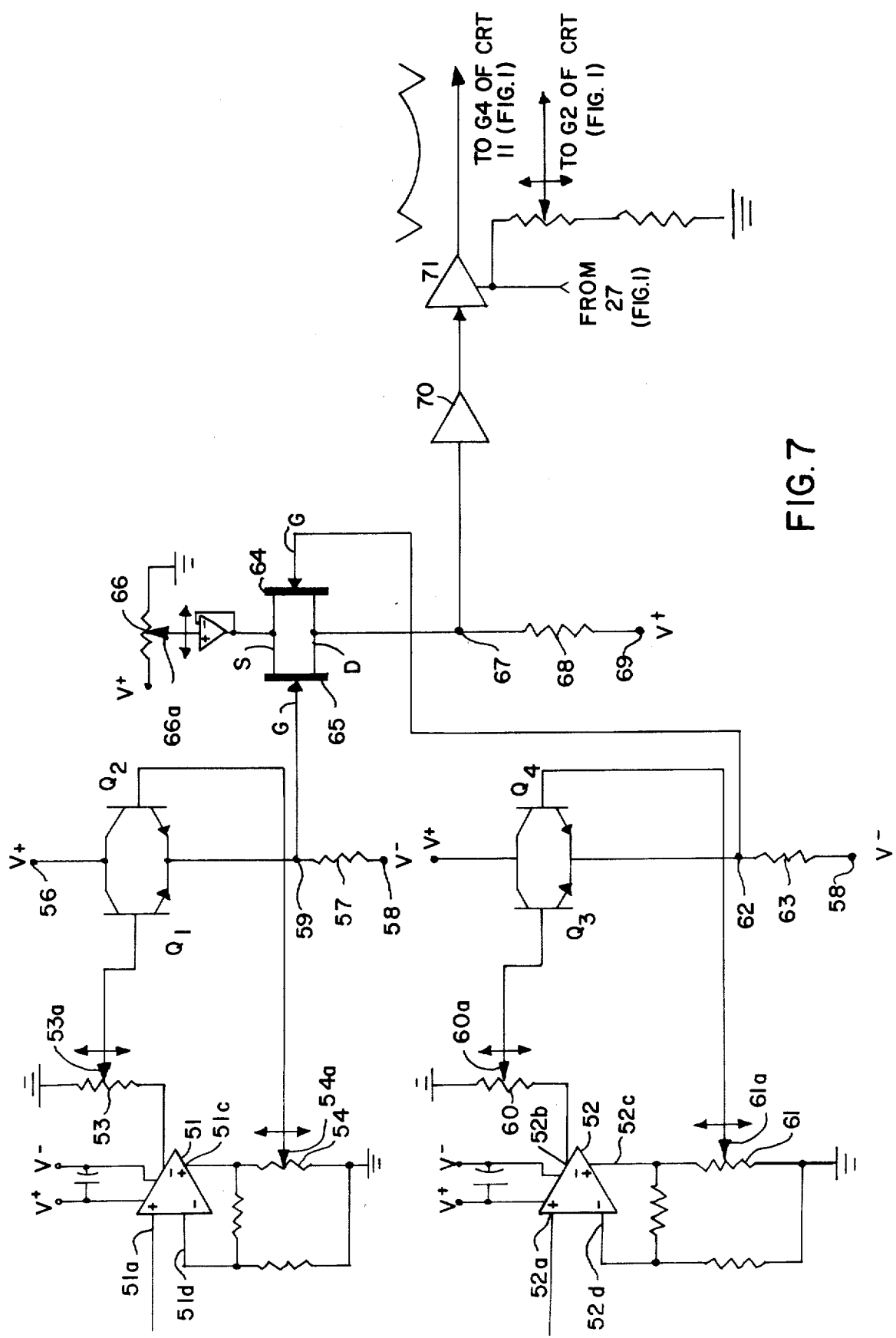
FIG. 7 is a schematic diagram of a circuit for developing a dynamic focus signal for use in the display device of FIG. 1 and which is driven by the horizontal and vertical sawtooth type deflection signals developed for example by the circuitry of FIG. 5 or FIG. 6.

The focusing voltage applied to the focusing electrode 16 of cathode ray tube 11 must have a parabolic wave shape which is capable of being generated independent of system operating frequency and which must be capable of being generated to a high degree of precision through the employment of inexpensive circuit means in order to achieve the above-mentioned objectives of low cost and reduced complexity. These objectives are accomplished in the present invention through the employment of the parabolic generating circuit 50 (forming part of circuit 24 in FIG. 1) shown in FIG. 7 and which is comprised of a pair of operational amplifiers 51 and 52 each having their non-inverting inputs 51a and 52a respectively adapted to receive the field (i.e. longer) and line (i.e. shorter) sawtooth deflection signals which are utilized to drive the vertical and horizontal deflection coils 23 and 22 shown, for example, in FIG. 1. The operational amplifiers 51 and 52 are each adapted to generate output signals at their outputs 51b, 51c and 52b, 52c, which represent the input signals in inverted and non-inverted fashion. Thus, a signal is developed across resistor 53 which is the same as the sawtooth signal 51 in amplified and inverted form, whereas resistor 53 develops a voltage which represents the sawtooth signal 51 in amplified and uninverted form. Adjustable switch arms 53a and 54a cooperate with resistors 53 and 54 to couple a portion of the voltage developed across these resistors to the base electrodes of transistors Q1 and Q2 respectively. Transistors Q1 and Q2 are coupled to form dual emitter followers having their collector electrodes connected in common to the V+ terminal 56 and having their emitter electrodes coupled in common to one terminal of resistor 57 whose opposite terminals are connected to the V-terminal 58. Transistors Q1 and Q2 form an absolute magnitude amplifier wherein the instantaneous absolute magnitude of the inverted and uninverted input signals is developed across common emitter resistor 57. Thus, at any given instant of time, the more positive portion of the inverted and non-inverted output signals applied to the base electrodes of transistors Q1 and Q2 control the voltage at terminal 59.

Operational amplifier 52 functions in substantially the identical manner whereby an amplified inverted sawtooth signal is developed across resistor 60 and an amplified uninverted sawtooth signal is developed across resistor 61. Adjustable switch arms 60a and 61a couple portions of these voltage signals, depending upon the positional adjustment of switch arms 60 and 60a, to the base electrodes of transistors Q3 and Q4 which form a second dual emitter follower circuit substantially identical to the dual emitter follower circuit formed by transistors Q1 and Q2, so as to develop an absolute value signal at the common terminal 62 between the dual emitter follower circuit and resistor 63. The output signals of terminals 59 and 62 are substantially "M"-shaped signals, terminal 59 developing a wide "M"-shaped signal and terminal 62 developing a narrow "M"-shaped signal.

The two "M"-shaped signals are simultaneously fed to a dual field effect transistor circuit comprised of first and second FET's 64 and 65 having their source electrodes coupled in common to adjustable switch arm 66a of resistor 66 and having their drain electrodes coupled in common to one terminal 67 of a resistor 68, whose opposite terminal 69 is coupled to V+.

The dual field effect transistors (FET's) 64 and 65 have a voltage-current characteristic whereby voltages applied to their gate electrodes from terminals 59 and 62 respectively develop an instantaneous drain current through the FET which is proportional to the square of the voltage applied to its associated gate electrode. Adjustment of the center focus of the dynamic focusing circuit is highly simplified requiring only an adjustment of switch arm 66a of resistor 66 for setting the pinch-off voltage of the dual FETs 64 and 65. Each edge of the display surface is adjusted independently by adjustment of the switch arms 53a, 54a, 60a and 61a thereby maximizing focus and cathode ray tube tolerances and thereby minimizing costly interactions.

The horizontal and vertical (i.e. field and line) parabolic signals which are summed at terminal 67, are applied to a high voltage high gain amplifier 70. The output of high voltage high gain amplifier 70 is coupled to an inverting amplifier 71 whose output is coupled to the focusing electrode 16 of the cathode ray tube 11 shown in FIG. 1.

The circuitry in FIG. 3 provides a high precision dynamic focusing signal which is a function of the horizontal and vertical sawtooth deflection signals which, as mentioned hereinabove, may be of varying frequency rates, circuit 50 being fully and dynamically responsive to any frequency changes and thereby assuring the generation of a dynamic focusing voltage through highly simplified and inexpensive circuitry.

AUTOMATIC SIZING

In order to be able to print flexible size fonts, it is desired to provide a ramp signal which deflects the electron beam of the cathode ray tube display device 10 so as to maintain a constant size display area at any input frequency and regardless of changes in input frequency.

Figure 4:
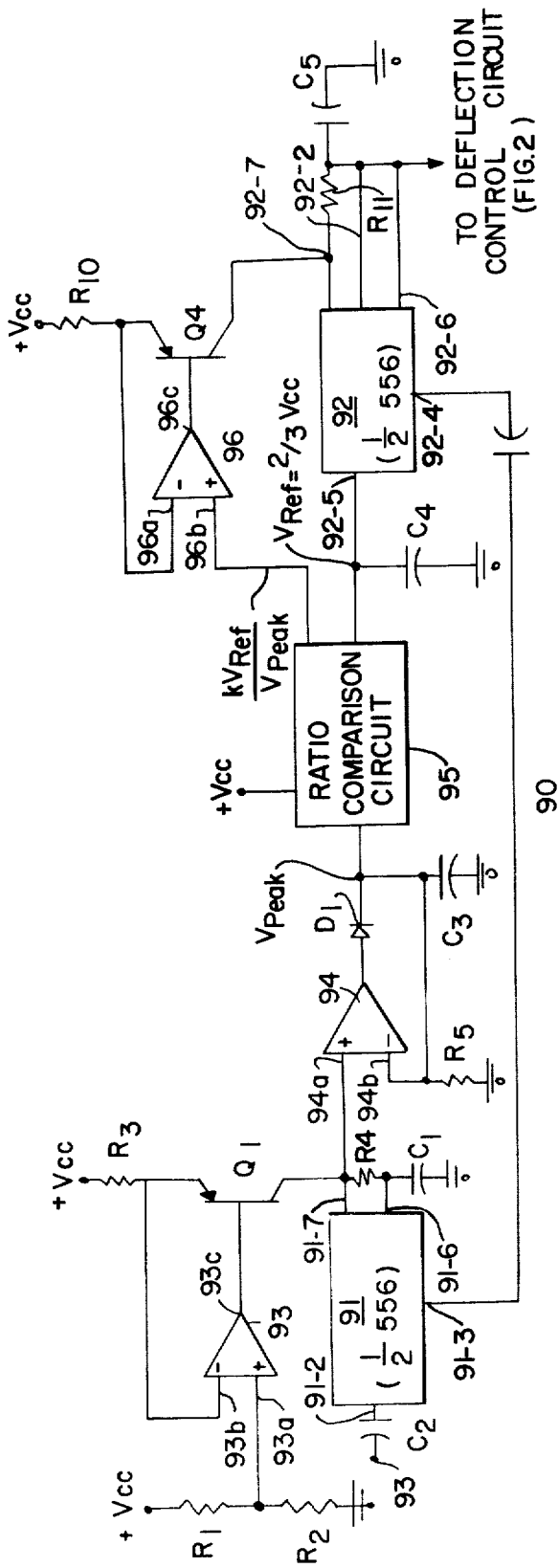
FIG. 4 shows a schematic diagram of an automatic sizing circuit for use in the display system of FIG. 1.
Figure 4:
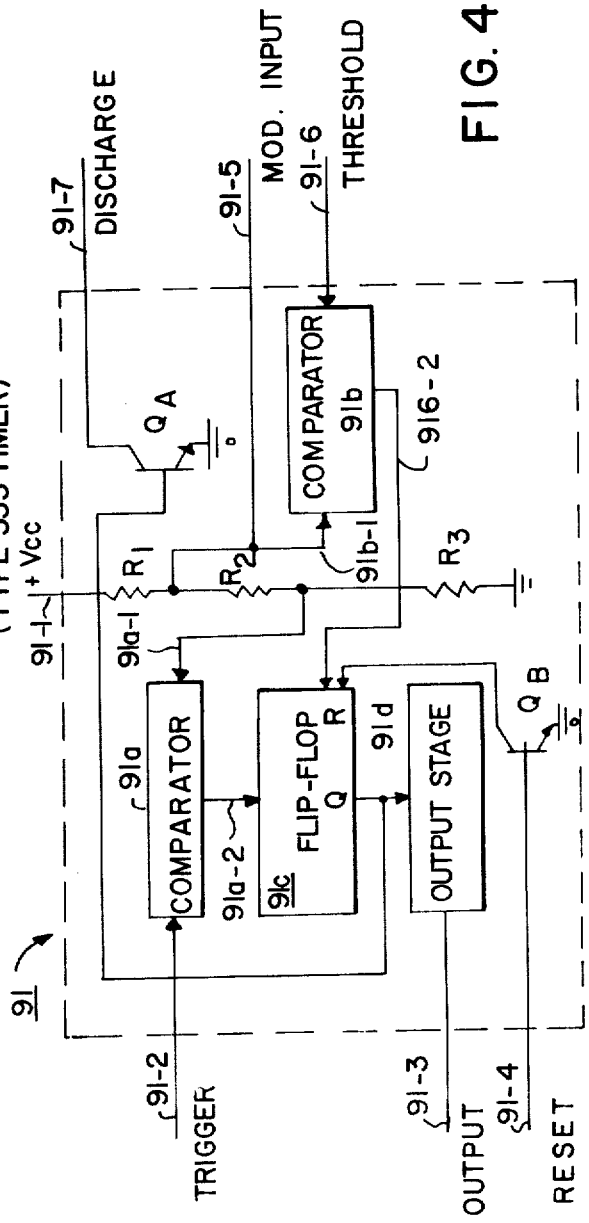

FIG. 4 shows one preferred embodiment 90 of the automatic sizing circuit for the "x" deflection signals. A similar circuit (not shown) is employed for the "y" deflection signals. The sizing circuit 90 is comprised of first and second timing circuits 91 and 92 which may, for example, be of the integrated circuit type. A circuit suitable for providing the operation desired in the present invention is the 555 timer produced, for example, by the Semiconductor Division of Raytheon. Alternatively, the solid-state timers employed may be of the 556 integrated type in which a pair of timers of the 555 type are provided in a single chip. FIG. 4a shows the basic building block structure of the timer 91, it being understood that the timer 92 of FIG. 4 is substantially identical thereto. Considering FIG. 4a, the timer 91 is adapted to receive a DC voltage at input 91-1. The series connected resistors R1, R2 and R3 form a series voltage divider circuit for establishing reference levels at inputs 91a-1 and 91b-1 of the comparators 91a and 91b. Comparators 91a and 91b compare the predetermined levels at 91a-1 and 91b-1 against input levels applied to the inputs 91-2 and 91-6 respectively, which are coupled to comparators 91a and 91b. The outputs 91a-2 and 91b-2 of comparators 91a and 91b are applied to respective input terminals of bistable flip-flop 91c. The Q output of bistable flip-flop 91c is coupled in common to one input of the output stage 91d and the base electrode of discharge transistor QA. Bistable flip-flop 91c may be reset upon receipt of a reset input signal at input terminal 91-4, which is coupled to the base electrode of transistor QB. The collector of QB is coupled to the reset input of flip-flop 91c. The manner of operation of the 555 timer circuit is well known and will not be described in detail. It is sufficient, however, for purposes of the present invention to understand that it is conventional to couple terminals 91-7 and 91-6 in common and to couple a capacitor between this common connection and ground potential. A resistor is typically connected between the +Vcc input 91-1 and the common terminal between inputs 91-7 and 91-6 to serve as a current source for charging the aforementioned capacitor. As soon as the capacitor charges to a level established at the input 91b-1 of comparator 91b, comparator 91b sets bistable flip-flop 91c to trigger output stage 91-3. Flip-flop 91c remains in the last state until reset by transistor QB or comparator 91a.

Returning to FIG. 4, a pair of constant current sources are coupled to each timer 91. One of said constant current sources is shown as being comprised of resistors R1 and R2 which are connected in series between voltage level +Vcc and ground or reference potential, the terminal between these resistors is coupled to the noninverting input 93a of operational amplifier 93b whose output 93c is coupled to the base electrode of transistor Q1. The emitter of Q1 is coupled through resistor R3 to +Vcc and is further connected in common to the inverting input 93b of operational amplifier 93. The collector of Q1 is coupled to one terminal of capacitor C1 whose opposite terminal is connected to ground or reference potential. The values of resistors R1 and R2 control the collector current in transistor Q1.

A capacitor C2 receives sync signals at input terminal 93 and couples the sync signals to the trigger input 91-2 (see FIG. 2a) which resets the bistable flip-flop 91c to drive transistor QA of timer circuit 91 (FIG. 4a) into cutoff allowing capacitor C1 to receive charging current from transistor Q1 to charge at a constant rate controlled by the voltage divider formed by resistors R1 and R2. The constant current charging capacitor C1 drives the voltage at terminal 91-7 of capacitor C1 to a predetermined threshold level equal ⅔ Vcc, at which time comparator 91b sets bistable flip-flop 91c to drive transistor QA (FIG. 4a) into conduction and thereby rapidly discharge capacitor C1. Thus, capacitor C1 develops a ramp signal of positive slope wherein the slope of the ramp is determined by resistors R1 and R2 and the peak value of the ramp is determined by the frequency rate of the sync pulse signals, the lower the frequency the larger the peak voltage and, vica versa.

The ramp signal developed across C1 is applied to the noninverting input 94a of operational amplifier 94 which, together with diode D1, capacitor C3 and resistor R5, forms a peak detector circuit for detecting and storing the peak voltage of the ramp signal developed at the positive terminal 91-5 of capacitor C1. The peak voltage of the ramp is coupled to one input of a ratio comparison circuit 95. The output ratio is coupled to +Vcc through resistor R9. The output ratio is further connected to an adjustable constant current generator comprised of operational amplifier 96 and transistor Q4. The noninverting input 96a of operational amplifier 96 is coupled to the output ratio while the emitter of Q4 is coupled to the inverting input 96b of operational amplifier 96. The emitter of Q4 is further connected to +Vcc through resistor R10. The output 96c of operational amplifier 96 is coupled to the base electrode of Q4, whose collector is connected in common to the discharge terminal 92-7 and trigger input 92-2 of timer circuit 92 (see FIG. 4a) and is further connected through resistor R11 to the threshold terminal 92-6. Capacitor C5 is connected between the collector of Q4 and ground or reference potential. The manner of operation of the automatic sizing circuit 90 of FIG. 4 is as follows:

A sync signal, which may be the sync signal for providing either horizontal or vertical sawtooth deflection signals, is applied to trigger input 93 to periodically reset bistable flip-flop 91c (see FIG. 4a) to drive capacitor QA (FIG. 4a) into cutoff. Upon termination of the sync signal, capacitor C1 begins to charge at a constant rate determined by the constant current generator comprised of resistors R1, R2 and R3, operational amplifier 93 and transistor Q1. The peak voltage level at the positive terminal 91-5 of capacitor C1 is a function of the charging current of the constant current generator and the frequency rate of the sync signals applied to input terminal 93 so that the higher the frequency rate the lower the peak voltage and vice versa. In the event that a sync signal is absent, the frequency rate of the ramp signal is determined by the reciprocal of the time period for the ramp developed by capacitor C5 to reach two-thirds of the supply voltage +Vcc, which is detected by comparator 91b coupled to the positive terminal of capacitor C5 through resistor R11. (See FIGS. 4 and 4a).

The peak voltage attained by the ramp signal is sensed by the peak detector circuit which retains the first ramp peak voltage and applies it to the ratio denominator. The ratio numerator is maintained at +⅔ Vcc. The signal level at the output is determined by the relative values of the signals applied to the numerator and denominator for controlling the adjustable constant current generator to correct the slope of the second ramp developed by capacitor C5 and maintain constant size of the display area regardless of the frequency of the input sync signals. For example, when the frequency rate of the sync signal applied to input 93 increases, less time is available for a capacitor C1 to charge at a constant rate causing the peak voltage to be lower. The lower peak voltage reduces the denominator voltage. Since the voltage at the numerator is maintained substantially constant, the current output increases to increase the voltage drop across resistor R9 thereby causing transistor Q4 to increase its level of conduction to charge capacitor C5 at a faster rate.

Conversely, when the sync signals are generated at a lower frequency rate, the positive terminal of capacitor C1 charges to a higher DC level to increase the denominator reducing the current ratio and hence reducing the collector current of transistor Q4 causing capacitor C5 to charge at a lower rate. When the voltage across capacitor C5 reaches a value equal to +⅔ Vcc the threshold terminal 92-6 causes comparator 91b to reset bistable flip-flop 91c (FIG. 4a) to thereby form a sawtooth signal of a constant peak value and of a frequency rate which is a function of the frequency of the input sync signals.

Since the second ramp signal must eventually retrigger itself when sync pulses are absent to assure continued operation of the display, the lowest frequency corresponds to the reciprocal of the time period for the second ramp to reach two-thirds of the supply level +Vcc. As is shown in FIG. 4, the positive terminal of capacitor C5 develops a sawtooth deflection signal of constant peak value and adjustable frequency for driving the horizontal (or vertical) deflection coil 22 (or 23), through the deflection circuit 30, for example.

COMPARISON CIRCUIT

Although the ratio amplifier module employed in the embodiment of FIG. 4 provides satisfactory operation, it has been found that a non-linear circuit is preferred in order to keep the sawtooth signal developed by capacitor C5 at a constant size automatically. A highly advantageous non-linear comparison circuit which may be substituted for the expensive ratio amplifier of FIG. 4 is shown in detail in FIG. 5 and is comprised of a resistor R12 coupled between the positive terminal of capacitor C1 of FIG. 4 and the inverting input 101a of operational amplifier 101. The noninverting input 101b is coupled to reference potential. Output 101c of operational amplifier 101 is coupled to the emitter of transistor Q5 whose base electrode is coupled to ground potential and whose collector electrode is coupled to the inverting input 101a of operational amplifier 101. The emitter of Q5 is coupled to the emitter of Q2 whose base and collector electrodes are coupled in common at terminal T1 to reference potential +⅔ Vcc through resistor R13. The collector of Q6 is coupled to the emitter of Q7 whose base and collector electrodes are coupled in common at terminal T2 to +24 volt DC terminal 102 through resistor R14. The common terminal T2 between the base and collector electrodes of Q3 is coupled to the base electrode of Q8 whose emitter is coupled to reference potential and whose collector is coupled to the +24 volt DC level through resistor R15. The collector of Q8 is coupled to the noninverting input 104a of operational amplifier 104. The output 104c of operational amplifier 104 is coupled to the base electrode of transistor Q9 whose emitter is coupled in common to resistor R16 and inverting input 104b of operational amplifier 104. The opposite terminal of resistor R16 is coupled to the +24 volt DC terminal 102. The collector of transistor Q9 is coupled to the positive terminal of capacitor C5 (see also FIG. 4). The manner of operation of the non-linear circuit of FIG. 5 is as follows:

The peak of the first ramp signal developed by the capacitor C1 (see FIG. 4) represents input frequency. For example, a range from 2 through 8 volts represents a range from 16 through 64 microseconds of active sweep time. Discharge resistor R12 of the peak detector is coupled to the virtual ground of operational amplifier 101. The output V101 of operational amplifier 101 is equal to zero minus the base emitter voltage Vbe of transistor Q5, i.e. V101=0−Vbe, where the base emitter voltage Q5 is the logarithm of the current through R12. Resistor R13 supplies the current from reference level +⅔ Vcc through transistor Q6. Transistor Q6 operates as a diode due to the short circuit connection between the base and collector electrodes of Q6 whereby the voltage Vc at the collector of Q6 is equal to the base emitter voltage VbeQ6 of Q6 minus the base-emitter voltage VbeQ5 of Q5, which signal (VbeQ6-VbeQ5) represents the difference of two logarithms. The antilog of this signal is produced by transistor Q8 whose temperature drift is compensated by transistor Q7 which also functions as a diode due to the short circuit connection between its base and collector electrodes. Thus, resistor R14 supplies the minimum current in the "mirror image" current mode of transistors Q7–Q8 which are integrated with Q5 and Q6 in one chip.

Although analog voltage multipliers and dividers are well known in the prior art, the logarithmic characteristic of transistors which are coupled to operate as diodes 25 in the circuit shown in FIG. 5, permits a division of the reference level (⅔ Vcc) by the peak value of the input sawtooth signal determined by the input frequency, in a precise and yet simple and inexpensive manner. Considering, for example, the waveforms 105 and 106, the capacitor C1 shown in FIG. 4 is charged at a constant rate and its peak voltage is controlled by the frequency rate of the sync signals applied to input 93. In the example given, capacitor C1 charges from ground potential to +⅔ Vcc in 64 microseconds for a line frequency of 15 kiloHertz. Capacitor C1 will charge to one-quarter of its peak level, i.e. 2/12 +Vcc over a time interval of 16 microseconds or a sync frequency rate of the order of 60 kiloHertz.

As can be seen from the waveforms 106, the peak level of the voltage across capacitor C5 is constant but the frequency rate is variable and is a function of the peak voltage attained by the input sawtooth signal.

Figure 6:
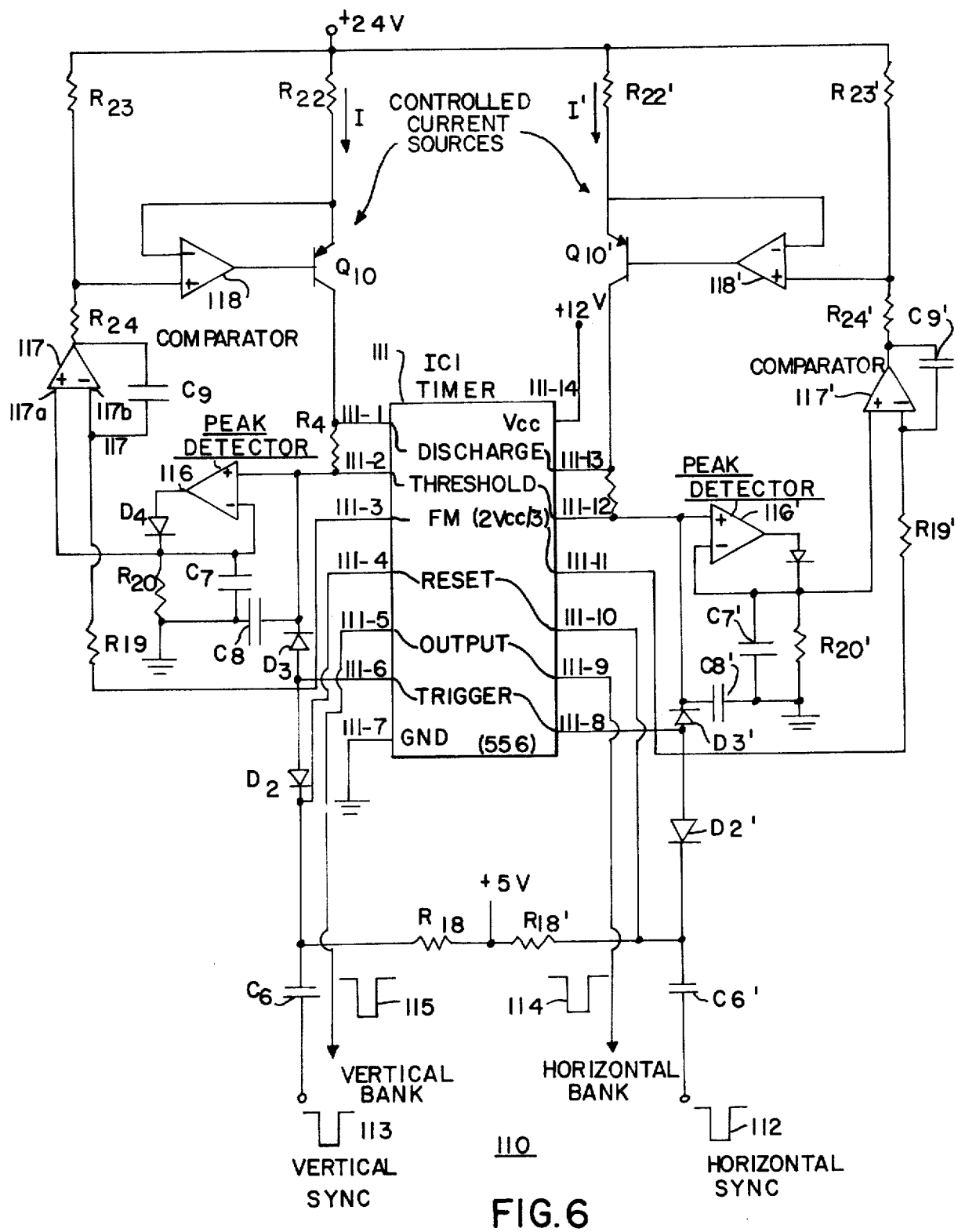
FIG. 6 shows another alternative embodiment of the automatic sizing circuit which may be employed with the system of FIG. 1 for generating both the horizontal and vertical sawtooth type deflection signals.

FIG. 6 shows another alternative embodiment 110 of the present invention which both the horizontal and vertical deflection sawtooth signals are generated through the use of either a single dual-timer integrated circuit 111. Alternatively, dual timer (type 556) may be replaced by a pair of individual timer integrated circuits (type 555) of the type shown in FIG. 4a. Thus, the alternative embodiment of FIG. 6 may be comprised of a type 556 dual timer or a pair of type 555 timers as was described hereinabove. Each timer half is triggered by a horizontal and a vertical sync signal 112 and 113 respectively, which timer halves are also adapted to provide proper horizontal and vertical blanking signals 114 and 115 respectively during the retrace portion of each sawtooth deflection signal.

Considering the circuitry employed for generating the vertical sawtooth signal, the vertical sync signal 113 is differentiated by capacitor C6 and resistor R18. This signal is coupled to the reset input of left-hand half of the 556 timer 111 to apply a reset signal to reset input 111-4 of the dual timer 111 which resets the bistable flip-flop of the left-hand half of timer 111 to drive the discharge transistor QA into cutoff (see FIG. 4a) and thereby allow capacitor C8 to be charged by the controlled current source comprised of operational amplifier 118 and transistor Q10. Current is applied to capacitor C8 through the collector of Q10 and resistor R21. Capacitor C8 charges to a maximum of ⅔ Vcc which level appears at output 111-3 of the left-hand timer circuit of dual timer 111 and is applied to the inverting input of operational amplifier 117. Operational amplifier 117 has a high gain and forms an integration circuit comprised of capacitor C9 and resistor R19 to produce the proper voltage at the noninverting input of operational amplifier 118 forming part of the aforementioned controlled current source. The noninverting input of operational amplifier 117 is coupled to the output of a peak detector circuit comprised of operational amplifier 116, diode D4, capacitor C7 and resistor R20 wherein the time constant of resistor R20 and capacitor C7 is sufficiently long to provide linear operation of the ramp sawtooth circuit but is short enough to respond to input frequency changes. The sawtooth signal having the higher frequency rate, which generally, but not necessarily, is the horizontal sawtooth signal, must have a slew rate capable of restoring the decay charge at the end of each horizontal line swept across the TV raster of the CRT display tube 11 (see FIG. 1). Since diode D4 is normally off, the output of operational amplifier 116 is negative until the sawtooth signal drives diode D4 into conduction.

In operation, the peak voltage level of the ramp signal developed across capacitor C8 is compared to the ⅔ Vcc reference level developed at output 111-3 with the peak level developed at the common terminal between diode D4, resistor R20 and capacitor C7. When the peak voltage detected is lower than the reference level, output 117c of operational amplifier 117 drops, causing the current through resistor R22 and transistor Q10 to increase which, in time, increases the charging current supplied to capacitor C8 and hence increases the slope of the sawtooth signal developed thereacross, so that the peak voltage rises automatically to the level of the aforesaid reference voltage. The low-pass filtering effect of resistor R19 and capacitor C9 stabilizes the loop of the sizing circuit whereby the R19-C9 time constant, together with the peak detector circuit determine the "capture" and "lock" frequencies of the phase-lock loop formed thereby.

In the absence of a sync signal, the voltage across capacitor C8 develops to the threshold level +⅔ Vcc which is applied to the threshold input terminal 111-2 which causes a comparator (see comparator 91b of FIG. 4a) to reset the bistable flip-flop 91c and activate discharge transistor QA to discharge timing capacitor C8. The discharge of timing capacitor C8 couples a negative going trigger voltage to input 111-6 which activates the comparator (see comparator 91a of FIG. 4a) through diode D3 to provide free-running operation at the minimum frequency rate to assure operation at least at the minimum frequency rate even in the absence of input sync signals. The right-hand half of the timer circuit 111 cooperates with like components designated with primes to develop the other required deflection signal.

Although the embodiment 110 of FIG. 6 is less versatile than the preferred embodiment of FIG. 4, when employing the comparison circuit of FIG. 5, the simplicity and reduced number of components of the embodiment shown in FIG. 6 are especially advantageous for use in applications for which the operating frequency range is less than one octave.

PROGRAMMABLE DIGITAL INTERFACE CIRCUIT

The display system of the present invention is further enhanced by high-speed video circuits of simplified design which permit selection of any one of a variety of combinations of drive circuits for controlling the cathode ray tube 11 (FIG. 1) without introducing skewing or delay problems typically encountered in conventional interface circuits which employ integrated circuit buffers and/or inverters.

PROGRAMMABLE INTERFACE CIRCUIT

Figure 8:
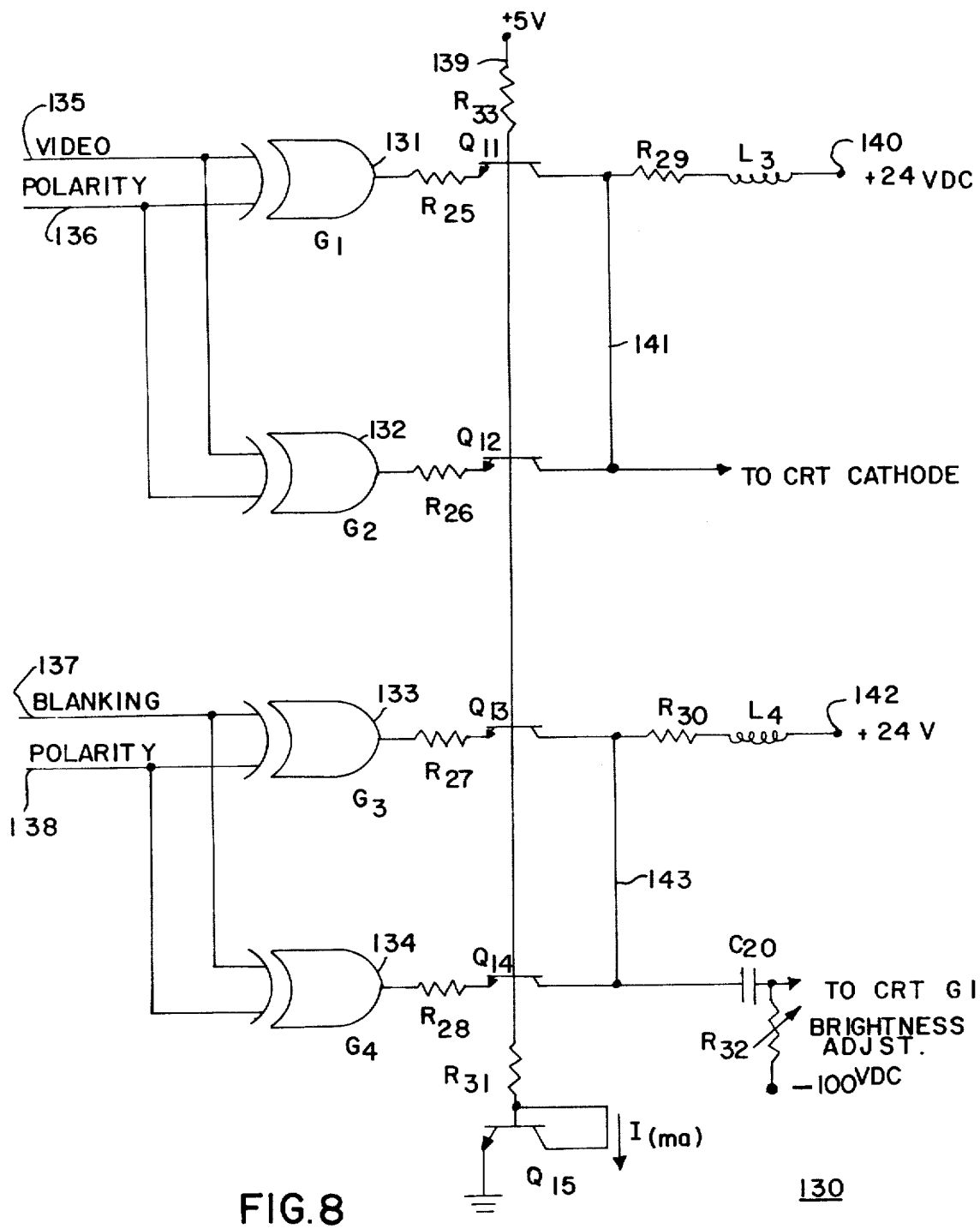
FIG. 8 is a schematic diagram of the programmable interface circuit coupling video and blanking signals of the digital type to the appropriate control electrodes of the display device shown in FIG. 1.

FIG. 8 shows a programmable digital type interface circuit 130 which may form part of the video circuit 25 of FIG. 1 and which is designed in accordance with the principles of the present invention and is comprised of four logic gates 131-134 of the Exclusive-OR (74586) type, each gate being designed to operate as a current sink for the associated cascode connected transistor Q11-Q14 respectively which have a 1 gigaHertz gain bandwidth product. Transistor Q15 is connected to draw the same emitter current as transistors Q11-Q14 in order to compensate for the base-emitter drift of the transistors Q11-Q14 integrated on one chip (like CA3127).

One input of Exclusive-OR gates 131 and 132 is coupled in common to a video input terminal 135 while the remaining input terminals of Exclusive-OR gates 131 and 132 are coupled in common to a polarity input terminal 136. In like fashion, the input terminal of Exclusive-OR gates 133 and 134 coupled in common to blanking input terminal 137 while the remaining inputs of the Exclusive-OR gates 133 and 134 are coupled in common to a polarity input terminal 138. The outputs of Exclusive-OR gates 131-134 are respectively coupled to the emitters of transistors Q11-Q14 through resistors R25-R28. The base electrodes of Q11-Q14 are coupled in common to constant reference level, applied at terminal 135, through resistor R33. The collectors of Q11 and Q12 are coupled in common through conductor 141 which the collectors of Q13 and Q14 are coupled in common through conductor 143. The common collectors of Q11 and Q12 are coupled through a second constant reference level applied to terminal 140 through resistor R29 and inductance L3. The output developed at the common connection of the collectors of Q11 and Q12 is adapted to be connected to the cathode electrode 13 of the cathode ray tube 11 shown in FIG. 1. Similarly, the collectors Q13 and Q14 are connected to the aforementioned second reference level applied to terminal 142 through series connected resistor R30 and inductance L4. The signal developed at the common connection of the collectors of Q13 and Q14 is applied to the G1 grid, i.e. the control grid 14 of cathode ray tube 11 shown in FIG. 1, through capacitor C20.

Resistor R31 coupled between the base electrode of Q14 and Q15 and resistor R33 cooperate to regulate the emitter current of Q15 to compensate for the base emitter drift of transistors Q11-Q14.

The characteristic of an Exclusive-OR gate is such that the output is low when both of its inputs are either low (i.e. binary zero) or high (i.e. binary one). Conversely, the output levels of the Exclusive-OR gates 131-134 are high when its inputs are in opposite binary states.

Arbitrarily assigning digital input signals applied to video input 135 for coupling to the cathode 13 of the cathode ray tube 11 and blanking signals applied to input 137 to be coupled to the controlled grid 14 of the cathode ray tube, the following truth table results:

| Video Input Signal | Blanking Input Signal | Video Polarity | Blanking Polarity | Cathode Level | Grid (G1) Level |
|---|---|---|---|---|---|
| 0 | 0 | 0 | 0 | ON | OFF |
| 0 | 1 | 0 | 0 | ON | ON |
| 1 | 0 | 0 | 0 | OFF | OFF |
| 1 | 1 | 0 | 0 | OFF | ON |
| 0 | 0 | 1 | 1 | OFF | ON |
| 0 | 1 | 1 | 1 | OFF | OFF |
| 1 | 0 | 1 | 1 | ON | ON |
| 1 | 1 | 1 | 1 | ON | OFF |
| 0 | 0 | 1 | 0 | OFF | OFF |
| 0 | 1 | 1 | 0 | OFF | ON |
| 1 | 0 | 1 | 0 | ON | OFF |
| 1 | 1 | 1 | 0 | ON | ON |
| 0 | 0 | 0 | 1 | ON | ON |
| 0 | 1 | 0 | 1 | ON | OFF |
| 1 | 0 | 0 | 1 | OFF | ON |
| 1 | 1 | 0 | 1 | OFF | OFF |

It can be seen that 16 different combinations are possible through the programmable digital interface circuit of FIG. 8, for example, providing a positive video input simultaneously with a negative blanking input may be utilized to increase beam intensity of the cathode ray tube electron beam. Conversely, reversing the signals through the application of a negative signal to the video input and a positive signal to the blanking input enables the generation of an inverse display wherein the absence of the electron beam identifies the presence of a character thereby developing a display of dark characters upon a bright background.

Since the Exclusive-OR gates 131-134 cut off their respective cascode transistors Q11-Q14 when the two input signals are applied to their input level, the polarity is controlled low for the non-inverting buffer and high for the inverting buffer. The maximum skew in the video circuit of FIG. 8 is only 0.5 nanoseconds within the Exclusive-OR gates whether operating as a buffer (non-inverter) or inverter. Thus, significantly reducing the maximum skew and delay while allowing the cathode ray tube display system to be driven by any one of a variety of control inputs up to the 16 combinations described herein.

The Exclusive-OR gates 131-132 and 133-134 and cascode transistors Q11-Q12 and Q13-Q14 are connected in pairs to provide sufficient drive for the cathode ray tube. The gates 131-134 would be deleted for pictorial, analog video.

A latitude of modification, change and substitution is intended in the foregoing disclosure and, in some instances, some features of the invention will be employed without a corresponding use of other features. Accordingly, it is appropriate that the appended claims be construed broadly in a manner consistent with the spirit and scope of the invention herein.

What is claimed is:

1. Deflection circuit means for providing a linear deflection current through the deflection coil of a cathode ray tube in response to an input ramp signal having a variable slope, a variable frequency and corrected for geometric distortion, comprising sensing means for developing a feedback signal representing the signal across said deflection coil;

means for comparing said input ramp signal having a variable frequency and slope and said feedback signal to develop a linear current through said deflection coil in accordance with said variable slope of said input ramp signal to maintain constant raster size regardless of deflection frequency; and means for removing said sensing means for developing a feedback signal and restoring energy within said deflection coil during retrace intervals and conserving energy within said deflection coil during trace and retrace intervals.

2. The deflection means of claim 1 wherein said sensing means comprises impedance means having a low impedance value to minimize the amount of output energy absorbed by said impedance means.

3. The deflection means of claim 2, wherein said impedance means comprises a resistor having an inductance of no greater than 0.1% of the inductance of the deflection coil.

4. The deflection means of claim 3 wherein said resistor is preferably less than one ohm and greater than 0.05 ohms.

5. The deflection means of claim 3, wherein said comparing means comprises an operational amplifier for comparing said input signal to said feedback signal.

6. The deflection means of claim 1, comprising first and second unidirectional current paths each including a switching means for selectively coupling its associated current path to said deflection coil; and means responsive to said comparing means for operating said switching means to alternately couple said current paths to said deflection coil during positive and negative portions of said ramp signal.

7. The deflection control means of claim 6 wherein said ramp signal includes a reset portion for generating a sawtooth waveform signal having a relatively long interval trace portion and a relatively short interval retrace portion;

semiconductor means coupled between said unidirectional current paths;

capacitor means forming a resonant circuit with said deflection coil whereby the energy stored in said deflection coil upon initiation of the retrace portion of said sawtooth signal is transferred to said capacitor means and is transferred back to said deflection coil before initiation of the next trace portion of the sawtooth signal; and said semiconductor means being responsive to the state of said capacitor means during said retrace portion for decoupling the current enabled during the retrace portion from said deflection coil so that the deflection coil is electrically isolated from both of said current paths during the retrace portion of the sawtooth signal.

8. The deflection control means of claim 7, further comprising means responsive to said comparing means for providing signals of opposing phase to said switching means to render said current paths conductive in a mutually exclusive fashion.

9. The deflection control means of claim 6 wherein said current path switching means each comprise a transistor, the transistors in one of said current paths being coupled to deliver current to said deflection coil and the transistor in the remaining current path being coupled to receive current from said deflection coil.

10. The deflection control means of claim 9, wherein the transistor in said one current path is coupled between a first reference level and said deflection coil and the transistor in said remaining current path is coupled between a second reference level and said deflection coil.

11. The deflection control means of claim 10, wherein said semiconductor coupling means is coupled between said transistor of said one current path and said deflection coil to enable the associated transistor to deliver current from said first reference level to said deflection coil and to prevent the associated transistor from delivering current to said deflection coil when the level at the coupling between the deflection coil and the semiconductor is substantially equal to said first reference level.

12. The difference control means of claim 10, wherein the difference between said first and second reference levels is substantially equal to the sum of the voltage drops across the transistors in said first and second current paths measured when said transistors are in saturation.

13. The deflection control means of claim 10, wherein said first reference is greater than said second reference level by an amount substantially equal to the voltage drop across the transistor at saturation and across said coupling semiconductor in said first current path to assure conduction therethrough when the transistor of said first current path is driven into conduction.

14. A sizing circuit for producing a sawtooth signal for driving a cathode ray tube to provide a constant display size regardless of timing changes in the frequency of sync signals, comprising:

a first charge storing means;

constant current generating means for charging said first charge storing means in a linear manner;

means responsive to each incoming sync signal for abruptly discharging said first charge storing means whereby the maximum voltage developed across said first capacitor represents the repetition rate of said sync signal;

peak detector means coupled to said first charge storing means for storing the peak voltage value developed by said first charge storing means;

second charge storing means;

adjustable current drive means for charging said second charge storing means; and comparing means having first and second inputs for comparing said peak voltage value applied at said first input by said peak detector means against a fixed reference level applied at said second input to develop a signal which represents the ratio of the signals being compared at said first and second inputs for adjusting the current gain of said adjustable current drive means to control the charging rate of said second charge storing means.

15. The automatic sizing circuit of claim 14 further comprising means for discharging said second charge storing means at predetermined fixed intervals independent of said sync signals.

16. The automatic sizing circuit of claim 15 wherein said means for discharging said second charge storing means further comprises means responsive to said second charge storing means reaching a predetermined threshold level for initiating said discharging means.

17. The sizing circuit of claim 14 further comprising means for discharging said first charge storing means when the voltage stored by said charge storing means reaches a predetermined value to thereby assure the generation of a sawtooth signal by said second charge storing means even in the absence of sync signals.

18. The sizing circuit of claim 14 wherein said comparing means comprises first means for converting said peak voltage level to a first signal representing the logarithm of said reference level;
  second means for converting said reference level to a signal representing the logarithm of said reference level;
  third means for developing a signal representing the difference between said first and second signals; and
  fourth means for converting said difference signal into its antilog for controlling the gain of said adjustable current driving means.

19. The sizing circuit of claim 18 wherein said first, second, and third means are each comprised of semiconductors connected in series fashion.

20. The sizing circuit of claim 18 wherein said second and third means are each comprised of transistors having emitter, base and collector electrodes, the collector and emitter of each transistor being directly coupled to operate as a diode.

21. The automatic sizing circuit of claim 18 further comprising semiconductor means for compensating for the temperature drift of said series connected semiconductors.

22. The sizing circuit of claim 18 wherein said first means comprises an operational amplifier having inverting and non-inverting inputs and an output; first semiconductor means coupled between said inverting input and said output for generating a voltage which is the logarithm of the current applied to the inverting input of said operational amplifier.

23. The automatic sizing circuit of claim 22 wherein said second and third means each comprise semiconductor means connected in series with said first semiconductor means.

24. The automatic sizing circuit of claim 23 wherein said first semiconductor is connected in opposing polarity relative to said second semiconductor.

25. The automatic sizing circuit of claim 24 wherein the second and third semiconductors are connected so that their polarities are not opposing one another.

26. Automatic sizing means for converting sync signals of a variable repetition rate to a sawtooth signal having a repetition rate equal to or less than the repetition rate of said sync signals and a control peak value, comprising:
  means responsive to said sync signals for generating a first linear sawtooth signal having a repetition rate equal to the repetition rate of said sync signals;
  means for detecting the peak level of said first sawtooth signal;
  a reference level for use in ratio or difference comparisons;
  means for generating a linear output sawtooth signal of a constant peak value and a repetition rate equal to the repetition rate of said sync signals and at a lesser ratio when sync signals are absent; and
  means responsive to said reference level and said peak level for adjusting the ramp of said output sawtooth signal as a function of the ratio of said peak and reference levels.

27. A comparison circuit for generating a signal representing the ratio of an incoming signal and a fixed reference level comprising:
  first means for converting the incoming signal to a first signal representing the logarithm of said peak value signal;
  second means for converting said fixed reference level to a signal representing the logarithm of said reference level;
  third means for taking the difference between said first and second signals; and
  fourth means for converting said difference signal into its antilog for controlling the gain of said adjustable current driving means.

28. Automatic sizing circuit means for providing sawtooth signals suitable for driving the horizontal and vertical deflection means of cathode ray tubes and the like, responsive to horizontal and vertical sync signals, each of said sawtooth signals being generated by means comprising:
  charge storing means;
  adjustable current drive means for charging said charge storing means in a linear fashion;
  means for determining the peak level of the charge developed in said charge storing means;
  a reference level;
  means comparing said peak level against said predetermined reference level for controlling the current gain of said current drive means;
  means responsive to each sync signal for discharging said charge storing means; and
  said charge storing means being charged to a predetermined constant level prior to the initiation of each sync signal.

29. Dynamic focus control means for focusing the electron beam of a cathode ray tube responsive to first and second sawtooth signals employed for deflecting the electron beam in mutually perpendicular directions, said focus control means comprising:
  first and second means for inverting said first and second sawtooth signals;
  third means generating a signal representing the instantaneous absolute value of the inverted and uninverted first sawtooth signals;
  fourth means for generating a signal representing the instantaneous absolute value of the inverted and uninverted second sawtooth signals; and
  means for combining the output signals generated by said third and fourth means including means for converting the current output of said combining means in a non-linear fashion as a function of the instantaneous level of the output signal developed by each of said third and fouth means to obtain dynamic focus of the electron beam over the entire display surface of the cathode ray tube.

30. The dynamic focus control means of claim 29 wherein said combining means comprises means for generating an output signal which is a square law function of the input signals applied thereto.

31. The dynamic focus control means of claim 29 wherein said combining means comprises first and second current generating means; and
  means for simultaneously regulating the current developed by said first and second current generating means for adjusting the center focus of the cathode ray tube.

32. The dynamic focus control means of claim 29 wherein said combining means comprises first and second field effect transistors for generating output currents which exhibit a square law characteristic such that their output current varies as a square of the control input applied to the gate of the field effect transistor.

33. The dynamic focus control means of claim 32 wherein said field effect transistors each have source, drain and gate electrodes;

the source electrodes of said first and second field effect transistors being coupled at a first common terminal;

the drain electrodes of said first and second field effect transistors being coupled at a second common terminal;

first and second reference levels; and first and second impedance means respectively coupling said first common terminal to said first reference level and said second common terminal to said second reference level.

34. The dynamic focus means of claim 33 wherein one of said impedance means comprises variable impedance means for regulating the impedance value of said variable impedance means to adjust the center focus of the dynamic focus signal.

35. The dynamic focus means of claim 29 wherein said first and second inverting means each comprises a differential amplifier for simultaneously generating inverted and uninverted output signals as its first and second outputs responsive to the sawtooth signal applied at the input of said differential amplifier; and adjustable means at said first and second outputs for independently regulating the magnitude of the signal at said first and second outputs to independently adjust the signal levels respectively applied to said third and fourth means.

36. The dynamic focus control means of claim 29 wherein said third and fourth means are each comprised of first and second transistors having collector, base and emitter electrodes;

a first reference level;

said collectors being coupled in common to said first reference level;

a second reference level and an impedance means coupled thereto;

said emitters being coupled in common to said impedance means; and said emitter electrodes being respectively coupled to receive said inverted and uninverted sawtooth signals associated therewith.

37. The dynamic focus control means of claim 29 further comprising amplifying means for amplifying and inverting the output of said combining means.

38. Means for selectively coupling the control signals employed to drive the cathode and control grid electrodes of cathode ray tube display tubes and the like while minimizing the skewing or delay experienced by the signals applied to the cathode and control grid due to buffering or inversion operations, comprising:

first and second gates each having a pair of inputs and being adapted to generate a first output level only when both of its inputs are either high or low and a second output level when its inputs are at different levels;

third and fourth means coupled to the outputs of said first and second gates respectively, for developing current signals when the outputs of said gates are at said first level whereby one input of each of said gates receives a digital control signal and the other inputs of said gates receive polarity control signals; and means for controlling the levels of the polarity control signals to couple control signals to the cathode and control grid electrodes of said display tube which are compatible with the operating characteristics of the display tube.

39. The control signal coupling means of claim 38 wherein said gates are exclusive-OR gates.

40. The control signal coupling means of claim 38 wherein each of said amplifying means comprises a transistor having emitter, base and collector electrodes;

each emitter electrode being coupled to the output of its associated gate; and each collector electrode being connected to an associated one of said display tube control grid and cathode electrodes.

41. The control signal coupling means of claim 40 further comprising means for coupling a constant reference level in common to the base electrodes of said transistors.

42. The control signal coupling means of claim 41 further comprising compensating transistor means coupled in common with said base electrodes for compensating for the base-emitter drift of said first and second transistors.

43. The control signal coupling means of claim 39 wherein said first and second gates each comprise a pair of gates having their first inputs and their second inputs respectively connected in common.

44. The control signal coupling means of claim 43 wherein said third and fourth means each comprise a pair of amplifying means each having their inputs each coupled to an output of one of said pair of gates and having their outputs connected in common.

45. The control signal coupling means of claim 44 wherein each of said pair of amplifying means comprises a transistor having base, emitter and collector electrodes;

the emitter electrodes each being connected to an output of one of said pair of gates;

said collector electrodes being connected in common; and said emitter electrodes being maintained at a common reference level.

46. Control circuitry for use in a display system comprising:

first means for receiving sync signals having a variable frequency for externally controlling the size of the data to be displayed on a fixed raster size;

second means coupled to said first means and responsive to said variable frequency sync signals for generating a sawtooth deflection signal of a constant peak value and a frequency rate equal to the variable frequency rate of said sync signals;

a deflection means;

third means coupled to said second means for driving said deflection means in a linear fashion;

fourth means for generating an input for electron beam geometric correction waveforms;

fifth means responsive to said third means for generating a dynamic focusing signal to maintain the electron beam waveform generated by said fourth means in focus regardless of the velocity and position to which the resulting electron beam is deflected and regardless of the manual adjustment of the focus at a position off display center; and sixth means responsive to digital information including up to four intensity levels for coupling binary control signals differentially to said electron beam waveforms without introducing skewing or delay problems at any display system raster frequency.

47. Automatic sizing circuit means for generating a sawtooth waveform deflection signal for cathode ray tube displays and the like from incoming sync signals, comprising:
- charge storing means;
- adjusting current drive means for charging said charge storing means in a linear fashion;
- a predetermined reference level;
- means for determining the peak level of the signal developed by said charge storing means;
- means comparing said peak level against said predetermined reference level for controlling the current gain of said current drive means as a function of the ratio of said predetermined reference level and said peak level;
- means responsive to each sync signal for rapidly discharging said charge storing means;
- said charge storing means being charged to said peak level prior to the initiation of each sync signal; and
- means for automatically discharging said charge storing means at a predetermined frequency rate in the absence of sync signals to assure generation of said sawtooth deflection signal, said predetermined frequency rate being equal to or less than any frequency rate established by said sync signals.

48. Automatic sizing circuit means for generating a sawtooth waveform deflection signal for cathode ray tube displays and the like from incoming sync signals, comprising:
- charge storing means;
- adjustable current drive means for charging said charge storing means in a linear fashion;
- a predetermined reference level;
- means for determining the peak level of the signal developed by said charge storing means;
- means comparing said peak level against said predetermined reference level for controlling the current gain of said current drive means as a function of the ratio of said predetermined reference level and said peak level;
- means responsive to each sync signal for rapidly discharging said charge storing means;
- said charge storing means being charged to said peak level prior to the initiation of each sync signal; and
- means responsive to the discharging of said charge storing means for generating a blanking pulse having a pulse interval equal to the time interval during which said charge storing means is discharged.

49. Automatic sizing circuit means for generating a sawtooth waveform deflection signal for cathode ray tube displays and the like from incoming sync signals, comprising:
- charge storing means;
- adjustable current drive means for charging said charge storing means in a linear fashion;
- a predetermined reference level;
- means for determining the peak level of the signal developed by said charge storing means;
- means comparing said peak level against said predetermined reference level for controlling the current gain of said current drive means as a function of the ratio of said predetermined reference level and said peak level, said means for comparing including low pass filter means for stabilizing the comparison operation;
- means responsive to each sync signal for rapidly discharging said charge storing means; and
- said charge storing means being charged to said peak level prior to the initiation of each sync signal.

50. Automatic sizing circuit means for generating a sawtooth waveform deflection signal for cathode ray tube displays and the like from incoming sync signals, comprising:
- charge storing means;
- adjustable current drive means for charging said charge storing means in a linear fashion;
- a predetermined reference level;
- means for determining the peak level of the signal developed by said charge storing means, said peak level determining means comprising delay means having a time constant which is small enough to respond to changes in frequency of said sync signal and large enough to assure linear charging of said charge storing means;
- means comparing said peak level against said predetermined reference level for controlling the current gain of said current drive means as a function of the ratio of said predetermined reference level and said peak level;
- means responsive to each sync signal for rapidly discharging said charge storing means; and
- said charge storing means being charged to said peak level prior to the initiation of each sync signal.

* * * * *